(12) United States Patent
McGraw et al.

(10) Patent No.: US 11,584,991 B2
(45) Date of Patent: Feb. 21, 2023

(54) APPARATUS AND METHOD FOR PRINTING MULTILAYER ORGANIC THIN FILMS FROM VAPOR PHASE IN AN ULTRA-PURE GAS AMBIENT

(71) Applicant: Universal Display Corporation, Ewing, NJ (US)

(72) Inventors: Gregory McGraw, Yardley, PA (US); William E. Quinn, Whitehouse Station, NJ (US); Gregg Kottas, Ewing, NJ (US); Siddharth Harikrishna Mohan, Plainsboro, NJ (US); Matthew King, Moorestown, NJ (US)

(73) Assignee: Universal Display Corporation, Ewing, NJ (US)

( * ) Notice: Subject to any disclaimer, the term of this patent is extended or adjusted under 35 U.S.C. 154(b) by 119 days.

(21) Appl. No.: 16/891,148

(22) Filed: Jun. 3, 2020

(65) Prior Publication Data
US 2020/0291521 A1 Sep. 17, 2020

Related U.S. Application Data

(62) Division of application No. 15/290,101, filed on Oct. 11, 2016, now Pat. No. 10,704,144.
(Continued)

(51) Int. Cl.
*C23C 16/455* (2006.01)
*C23C 14/12* (2006.01)
(Continued)

(52) U.S. Cl.
CPC .......... *C23C 16/45563* (2013.01); *B41J 2/00* (2013.01); *C23C 14/12* (2013.01); *C23C 14/24* (2013.01);
(Continued)

(58) Field of Classification Search
CPC .. B41J 2/04; H01L 51/0005; C23C 16/45563; C23C 16/45519
See application file for complete search history.

(56) References Cited

U.S. PATENT DOCUMENTS

| 4,294,868 A | 10/1981 | Kalbskopf |
| 4,769,292 A | 9/1988 | Tang |

(Continued)

FOREIGN PATENT DOCUMENTS

| GB | 2360489 A | 9/2001 |
| JP | 2007520854 A | 7/2007 |

(Continued)

OTHER PUBLICATIONS

Baldo et al. Highly efficient phosphorescent emission from organic electroluminescent devices, Nature, vol. 395, pp. 151-154, 1998.
(Continued)

*Primary Examiner* — Joseph A Miller, Jr.
(74) *Attorney, Agent, or Firm* — Butzel Long

(57) ABSTRACT

Systems and techniques for depositing organic material on a substrate are provided, in which one or more shield gas flows prevents contamination of the substrate by the chamber ambient. Thus, multiple layers of the same or different materials may be deposited in a single deposition chamber, without the need for movement between different deposition chambers, and with reduced chance of cross-contamination between layers.

8 Claims, 22 Drawing Sheets

Related U.S. Application Data

(60) Provisional application No. 62/240,148, filed on Oct. 12, 2015.

(51) Int. Cl.
    *H01L 51/00*      (2006.01)
    *C23C 14/24*      (2006.01)
    *B41J 2/00*      (2006.01)

(52) U.S. Cl.
    CPC ...... *C23C 14/243* (2013.01); *C23C 16/45519* (2013.01); *H01L 51/0005* (2013.01)

(56) References Cited

U.S. PATENT DOCUMENTS

| | | | |
|---|---|---|---|
| 5,122,391 A * | 6/1992 | Mayer | C23C 16/453 427/255.35 |
| 5,136,975 A | 8/1992 | Bartholomew | |
| 5,247,190 A | 9/1993 | Friend | |
| 5,413,671 A | 5/1995 | Ketchum | |
| 5,424,103 A | 6/1995 | Ahn | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 5,938,851 A | 8/1999 | Moshtagh | |
| 6,013,982 A | 1/2000 | Thompson | |
| 6,022,414 A | 2/2000 | Miller | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,737,812 B2 | 5/2004 | Yuasa | |
| 7,279,704 B2 | 10/2007 | Walters | |
| 7,404,862 B2 | 7/2008 | Shtein | |
| 7,431,968 B1 | 10/2008 | Shtein | |
| 7,744,957 B2 | 6/2010 | Forrest | |
| 7,879,410 B2 | 2/2011 | Che | |
| 7,897,210 B2 | 3/2011 | Shtein | |
| 7,968,146 B2 | 6/2011 | Wagner | |
| 8,293,329 B2 | 10/2012 | Forrest | |
| 8,613,496 B2 | 12/2013 | Forrest | |
| 8,728,858 B2 | 5/2014 | Mohan | |
| 8,851,597 B2 | 10/2014 | Forrest | |
| 8,944,309 B2 | 2/2015 | Forrest | |
| 2001/0047756 A1 | 12/2001 | Bartholomew | |
| 2003/0230980 A1 | 12/2003 | Forrest | |
| 2004/0174116 A1 | 9/2004 | Lu | |
| 2005/0030496 A1 | 2/2005 | Chibana | |
| 2005/0087131 A1 | 4/2005 | Shtein | |
| 2005/0110005 A1 * | 5/2005 | Forrest | H01L 51/0504 257/40 |
| 2006/0127599 A1 | 6/2006 | Wojak | |
| 2009/0130780 A1 | 5/2009 | Day | |
| 2010/0151654 A1 | 6/2010 | Yamauchi | |
| 2011/0033638 A1 | 2/2011 | Ponnekanti | |
| 2011/0067632 A1 | 3/2011 | Poppe | |
| 2011/0097495 A1 * | 4/2011 | Burrows | C23C 14/564 239/128 |
| 2013/0038649 A1 | 2/2013 | Lowrance | |
| 2013/0208036 A1 * | 8/2013 | Forrest | B41J 11/008 347/8 |
| 2014/0007811 A1 | 1/2014 | Cheng | |
| 2014/0057390 A1 | 2/2014 | Mohan | |
| 2014/0116331 A1 | 5/2014 | Forrest | |
| 2014/0127404 A1 | 5/2014 | Yudovsky | |
| 2014/0131311 A1 | 5/2014 | Joo | |
| 2014/0138629 A1 | 5/2014 | Forrest | |
| 2014/0220720 A1 | 8/2014 | Harikrishna Mohan | |
| 2015/0376787 A1 | 12/2015 | McGraw | |

FOREIGN PATENT DOCUMENTS

| | | |
|---|---|---|
| JP | 2010513719 A | 4/2010 |
| JP | 2014103112 A | 6/2014 |
| WO | 2008057394 A1 | 5/2008 |
| WO | 2010011390 A2 | 1/2010 |
| WO | 2012003440 A2 | 1/2012 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Extended European Search Report dated Feb. 27, 2017 as received in Application No. 16193557.2.

M. S. Arnold et al., "Direct vapor jet printing of three color segment organic light emitting devices for white light illumination," Applied Physics Letters 92, 053301 (2008), 4 pages.

S. Biswas et al., Solvent-free, direct printing of organic semiconductors in atmosphere App. Phys. Lett. 96 263301 (2010), 4 pages.

Japanese Office Action (with English language translation) for App No. JP2016-200885, dated Apr. 28, 2020, 13 pages.

* cited by examiner

APPARATUS AND METHOD FOR PRINTING MULTILAYER ORGANIC THIN FILMS FROM VAPOR PHASE IN AN ULTRA-PURE GAS AMBIENT

CROSS-REFERENCE TO RELATED APPLICATIONS

This application is a divisional application of, and claims benefit to, U.S. patent application Ser. No. 15/290,101, filed Oct. 11, 2016, which is a non-provisional application of, and claims benefit to, U.S. Provisional Patent Application Ser. No. 62/240,148, filed Oct. 12, 2015, the entire contents of which is incorporated herein by reference in its entirety.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to techniques for fabricating devices such as organic light emitting diodes and other devices, including the same, using a shield gas that may be disposed external to a deposition system such as a nozzle block.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

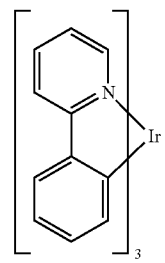

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In an embodiment, an organic printing deposition system is provided, which includes a print head having a nozzle block with a delivery aperture. The delivery aperture is in fluid communication with a source of organic material to be deposited on a substrate by the printing deposition system. The print head further includes one or more shield gas distribution channels, each of which is disposed above or below the delivery aperture when viewed from below the nozzle block. The print head also may include one or more exhaust channels disposed adjacent to the delivery aperture such that, during operation of the print head, non-condensing gas flow generated by the delivery aperture is captured by an exhaust aperture. Each shield gas distribution channels may be arranged to provide a flow of shield gas that prevents material from a chamber ambient in which the print head is operated from reaching the exhaust apertures of the nozzle block. In some embodiments, the print head may be removeable from the chamber as a single one-piece unit. The print head also may be resistively heated.

In some embodiments, the system may include one or more shield gas apertures, each of which ejects shield gas into the space between the substrate and the print head during operation of the print head such that all gas ingested by the exhaust apertures originates from either the delivery aperture or one or more of the shield gas apertures. The shield gas apertures may be provided by nozzles surrounding the print head containing the nozzle block, and/or on a chiller plate disposed between the print head and substrate. The shield gas apertures may be arranged in arrays parallel to the direction of printed features.

In embodiments which include a chiller plate, the chiller plate may include one or more exhaust apertures disposed on the chiller plate that withdraw shield gas from the deposition chamber. The chiller plate also may include one or more windows having rounded edges, fairings, or a combination thereof to reduce turbulence in the shield gas flow. The windows also may be apertures through which the print head extends during operation.

In an embodiment, the print head may be moveable in the direction of the substrate normal independently of other components of the organic printing deposition system. An angle between the nozzle block and the substrate may be adjustable independently of other components of the organic printing deposition system.

In an embodiment, the system includes multiple print heads as previously described, mounted in a single deposition chamber. The print heads may be mounted on a common, articulated carriage. The shield gas apertures may be arranged on the nozzle block along a perimeter of the substrate-facing side of the articulated carriage. At least one of the print heads may be an OVJP print head.

In an embodiment, a method of depositing at least two thin film layers on a substrate in a single deposition chamber is provided, in which each of the thin film layers may be compositionally distinct from the other or spatially offset so that each film is only partially overlapping with the others. The method may include ejecting a first deposition mixture from a first delivery aperture on a first nozzle block disposed within a deposition chamber toward a substrate, ejecting a second deposition mixture from a second delivery aperture on a second nozzle block toward the substrate, ejecting a first shield gas from a first shield gas aperture, and removing material from the deposition chamber via a first exhaust aperture in the nozzle block. The first shield gas may prevent material from the chamber ambient from reaching the exhaust aperture and prevents material ejected by the first delivery aperture from entering a region comprising at least a region between the second delivery aperture and the substrate. The first deposition mixture and the second deposition mixture may not share any common materials, or may share one or more materials in different ratios. The method may further include moving at least one of the nozzle block and the substrate relative to the other during ejection of the first deposition mixture and the first shield gas. During operation, the total flow of shield gas around the nozzle block may exceed the total flow of exhaust through the nozzle block. The total flow of exhaust gas through one or more exhaust apertures in the nozzle block may exceed the total flow of deposition mixture through one or more delivery apertures in the nozzle block. During operation the ambient pressure in the deposition chamber may be in the range of 10 Torr-1000 Torr.

In an embodiment, the method may further include reducing the fly height between the nozzle block and the substrate when the print head is over a region of the substrate on which a material is to be deposited, and increasing the fly height between the nozzle block and the substrate when the print head is over a region of substrate on which material is not to be deposited.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
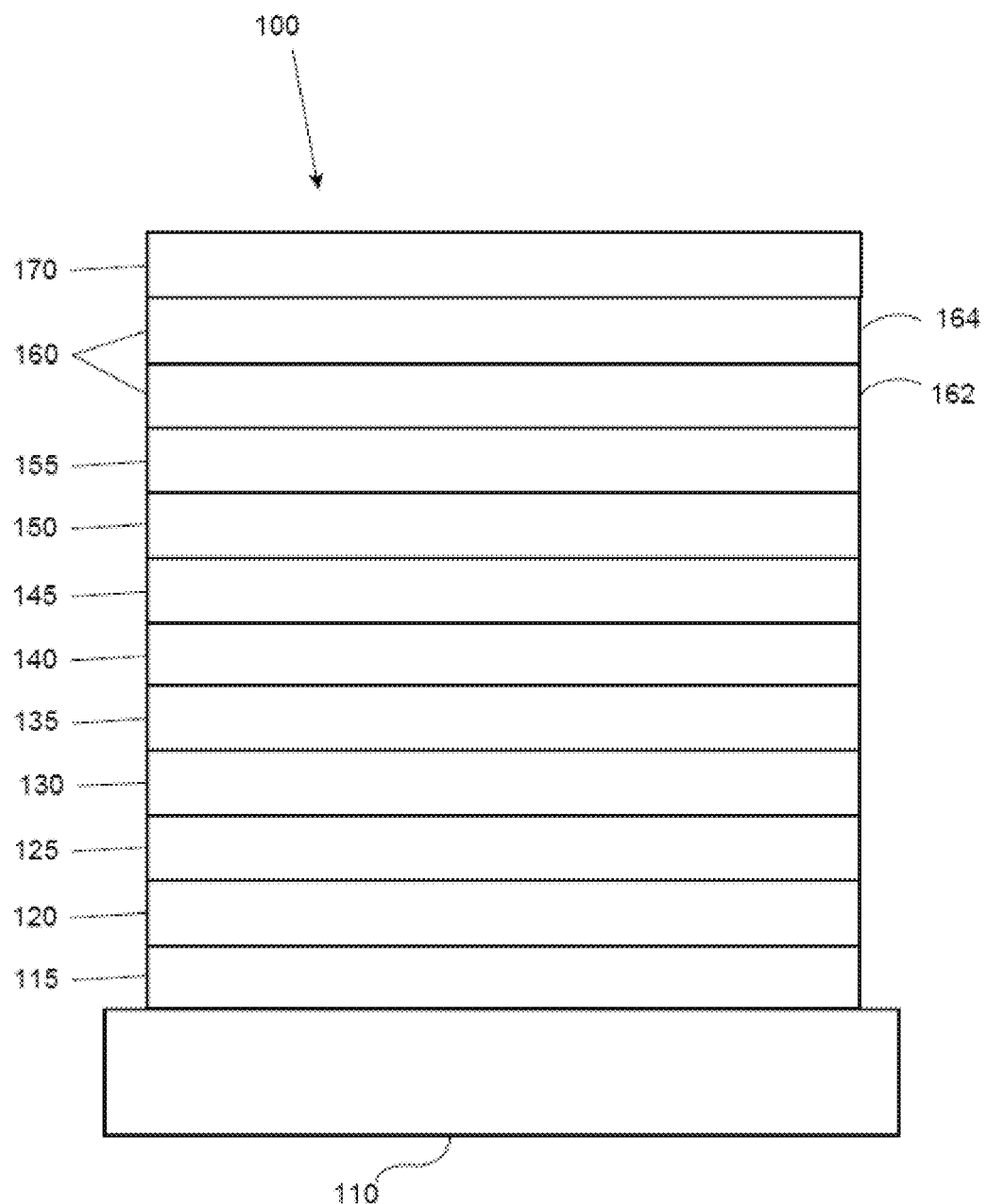
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
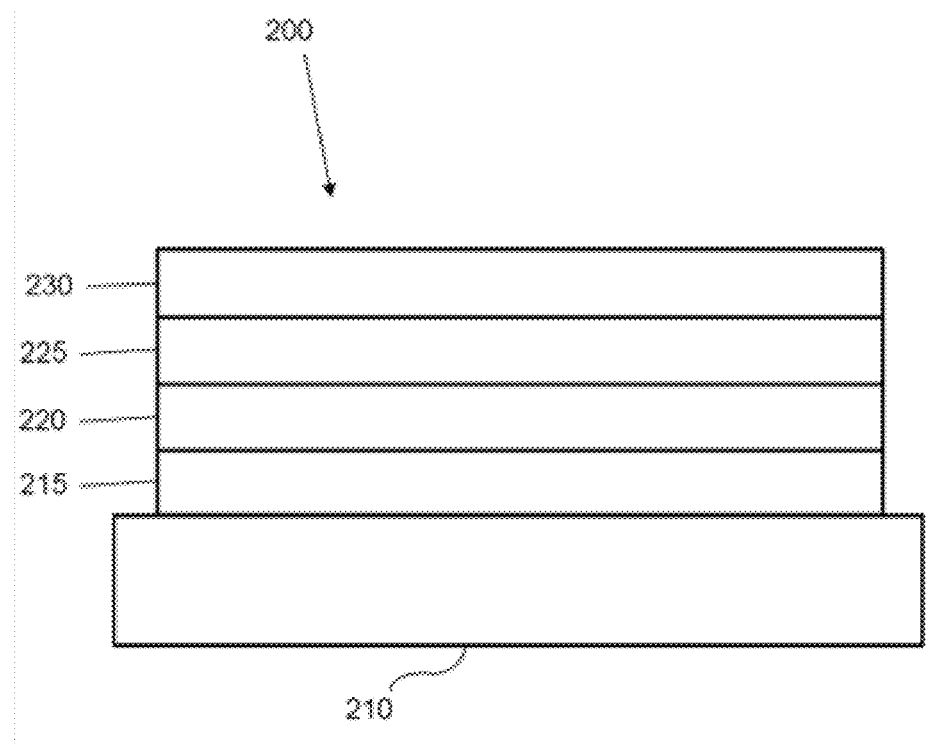
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, virtual reality displays, augmented reality displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C. to 30 C., and more preferably at room temperature (20-25 C.), but could be used outside this temperature range, for example, from −40 C. to +80 C.

Forced convection with an inert carrier gas is used to control the flux of vapor for thin film deposition. The disclosed invention applies this technique in a novel way to OLED fabrication. The closest prior technique is spatial atomic layer deposition (ALD), which is used for fabricating thin films for electronic applications. It creates isolated, chemically homogenous pockets of vapor for deposition that alternate along the direction of travel as a substrate is moved relative to a depositor. This is done to promote a chemical reaction on the substrate surface that requires exposure to rapid alternation of two or more gas species. In contrast, embodiments disclosed herein relate to film growth by physisorption as opposed to chemisorption. ALD typically is used only for broad area deposition, whereas embodiments disclosed herein may be used to deposit a pattern, such as a line of pixels, on a substrate. As disclosed in further detail herein, each zone of vapor may deposit a distinct thin film layer in a multilayer stack, as opposed to alternating zones increasing the thickness of a layer having a single, uniform composition.

Furthermore, typical confinement schemes in spatial ALD techniques are two-dimensional. In contrast, techniques disclosed herein may provide three-dimensional confinement through the use of a shield gas that creates chemically distinct regions of vapor along the axis of motion of a moving substrate. A curtain of confinement gas may be provided on the sides of a deposition zone to block spread of carrier gas along the in-plane direction orthogonal to the direction of substrate motion relative to the depositor. A shield gas may isolate vapor deposition zones from the chamber and from each other, but also may act as a source of confinement gas to narrow printed features along their critical dimension. There is also a topological difference in the way the shield gas is employed. A "purge gas port" as described in an ALD arrangement (shield gas aperture) typically may need not be surrounded by pump ports (exhaust apertures) in embodiments of the present disclosure.

The integration of delivery-exhaust-confinement organic vapor jet printing (DEC OVJP) into OLED fabrication typically uses a streamlined process for producing multi-layer organic structures. While DEC OVJP can deposit a patterned emissive layer with high resolution, this typically provides only one of multiple thin film organic layers required to fabricate an OLED. The remaining organic layers are usually deposited by vacuum thermal evaporation.

Figure 3:
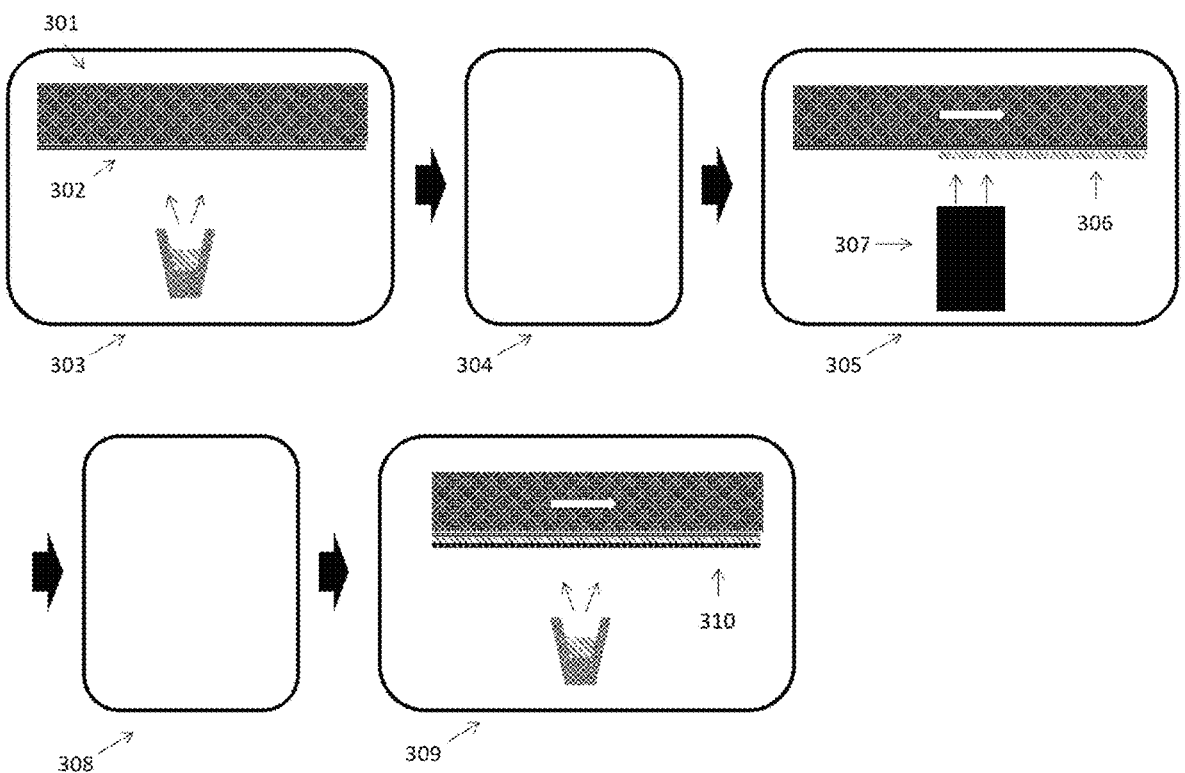
FIG. 3 shows an example process flow diagram of a device fabrication technique using only conventional OVJP to deposit an emissive layer of a device.

Integrating conventional VTE techniques and OVJP into a common production line typically requires the use of load locks between the VTE and OVJP chambers. In a typical bottom emitting OLED as shown in FIG. 3, a transparent substrate 301 is coated with a first set of thin film layers 302 including, for example, a hole injection layer (HIL), a hole transport layer (HTL) an electron blocking layer (EBL), and/or other layers, for example as previously described with respect to FIGS. 1-2. These layers may be deposited in one or more vacuum thermal evaporation chambers held at high or ultrahigh vacuum, e.g., $10^{-8}$ Torr. A DEC OVJP process best operates in a pressure regime between 50 and 200 Torr, so an intermediate load lock chamber 304 typically is used between the VTE and OVJP 305 chambers to equalize pressure with each side prior to transfer of the substrate. This can be both time consuming and wasteful of ultrahigh purity process gas. One or more emissive layers 306 is deposited on the substrate by OVJP by one or more print heads 307, such that each head deposits a specific organic vapor mixture to form each color required in the emissive layer(s). Once printing is complete, a second load lock 308 is required to transfer the substrate from the relatively high pressure OVJP chamber to a second VTE chamber 309 or set of VTE chambers and other physical vapor deposition PVD tools. The set of deposited films 310 may include, for example, a hole/exciton blocking layer (HBL), electron transport layer (ETL), electron injection layer (EIL), and/or a metal or conductive oxide electrode, and the like.

Depositing different layers of an organic thin film in separate process chambers also creates potentially long delays both between the deposition of the emissive layer over its underlying layer and between the deposition of the emissive layer and the deposition of further layers over top of it. These delays increase the potential for residual gasses such as oxygen or water vapor in either the OVJP chamber or load locks to contaminate the substrate surface. Also, the possibility for particle contamination increases during the transfers between different chambers. If contamination occurs between thin film depositions, contaminants can become buried within the stack and contaminate the organic heterojunction, reducing device performance and lifetime.

The potential for contamination can be exacerbated by the OVJP processes. The OVJP process generally prints small areas of a substrate to completion before moving on to another area. Consequently, the first regions of a substrate to be printed are exposed to the chamber ambient while the remaining regions of the substrate are printed. Likewise, regions of substrate that are not immediately printed may be exposed to contamination while awaiting printing. Some embodiments of DEC OVJP use confinement flows sourced from the chamber ambient and can draw residual gas contamination into the printing zone. The additional load locks required by OVJP introduce additional complexity and they can require significant time to pump down or backfill, reducing the potential economic benefit of the OVJP process and possibly allowing further contamination.

The rate at which contaminant molecules bombard a surface is $j=P/(2\pi m k_B T)$, where j is the flux of the contaminant, P is the partial pressure of the contaminant vapor, m is the molecular mass of the contaminant, kB is Boltzmann's constant, and T is temperature. The primary contaminant of concern in OVJP is water vapor. If there is 0.1 ppm water vapor in a 150 Torr process chamber, then the flux of water molecules onto the substrate is $4.3 \times 10^{14}$ molecules/(cm$^2$s). A monolayer of water requires $10^{15}$ molecules per cm$^2$, assuming a molecular diameter of 3 Å and hexagonal packing. The actual deposition rate of water depends on multiple factors; however a substrate can become inundated with water in as little as 2-3 seconds, even in an extremely dry environment.

Figure 4:
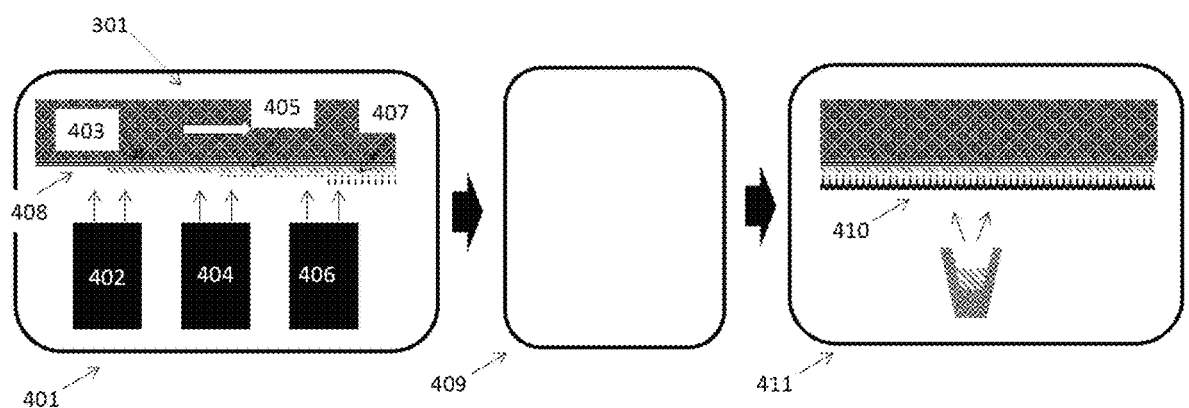
FIG. 4 shows a series of nozzles being used to sequentially deposit layers of dissimilar materials on a moving substrate.

One way to reduce water contamination is to reduce the amount of time an organic film is exposed to the chamber ambient. As shown in FIG. 4, placing multiple nozzle array print heads in a chamber to each deposit a single layer of an organic thin film stack inside of a single OVJP chamber 401 reduces the delay between the depositions of successive organic layers. Each organic layer in the stack can be deposited and patterned by a separate nozzle array that passes over the substrate sequentially. In an embodiment, a first nozzle array 402 deposits an HTL 403, a second nozzle array 404 deposits an EML 405 over the HTL, and a third nozzle array 406 deposits an ETL 407 over the EML, into the surface of a substrate 301 pre-patterned with a transparent conducting oxide electrode. The interval between the deposition of the first and last component of a multilayer organic thin film can be very short, on the time scale of seconds, reducing the opportunity for contaminants to become buried within the layer. Multiple DEC OVJP print heads may also be used to print an organic thin film with graded doping the manner disclosed in US20140220720, such that each print head deposits a layer with a different doping ratio.

Deposition of a cathode 410 in a vacuum chamber 411 is normally required after the organic layers have been deposited. Such an arrangement still requires transfer of the substrate through a load lock 409. The effect of contamination on an OLED depends on the growth step at which it is introduced. Yamamoto et al. showed that the operational lifetime of a phosphorescent OLED fabricated by VTE is significantly reduced if the HTL, EML, or heterojunction between them is exposed to traces of water vapor. Since the HTL and EML are likely to be different for each color subpixel of a multicolor OLED array, they must be deposited with high spatial resolution and are good candidates for DEC OVJP printing. The confinement of organic vapor by DEC OVJP allows adjacent subpixels of different color to be printed side by side on a single substrate without cross-contamination. Furthermore, this confinement prevents organic vapor from migrating away from the DEC OVJP head and contaminating the far-field of the substrate, neighboring deposition heads, and other chamber components. Experiments by Biswas, Pipe and Shtein using OVJP to print OLEDs in air indicate some organic materials, such as $Alq_3$, can withstand exposure to oxygen and moisture during fabrication without adversely affecting the resulting devices. Since the $Alq_3$ is an ETL material and normally the last organic layer to be deposited in OLED fabrication, it can protect more sensitive organic layers beneath it from residual chamber gasses until a cathode is applied.

Each print head in the chamber may deposit a compositionally-distinct organic thin film. For example, the films may contain different chemical species, or they may contain the same chemical species mixed in different ratios. For example, an OLED emissive layer with graded doping can be built up by depositing several thinner layers of host-dopant mixture with successively greater dopant concentration over top of each other, as described in U.S. Patent Publication No. 2014/0220720, the disclosure of which is incorporated by reference in its entirety. Layers of an organic thin film may be deposited by different print heads tuned to deposit mixed organic material at different doping ratios.

Figure 5:
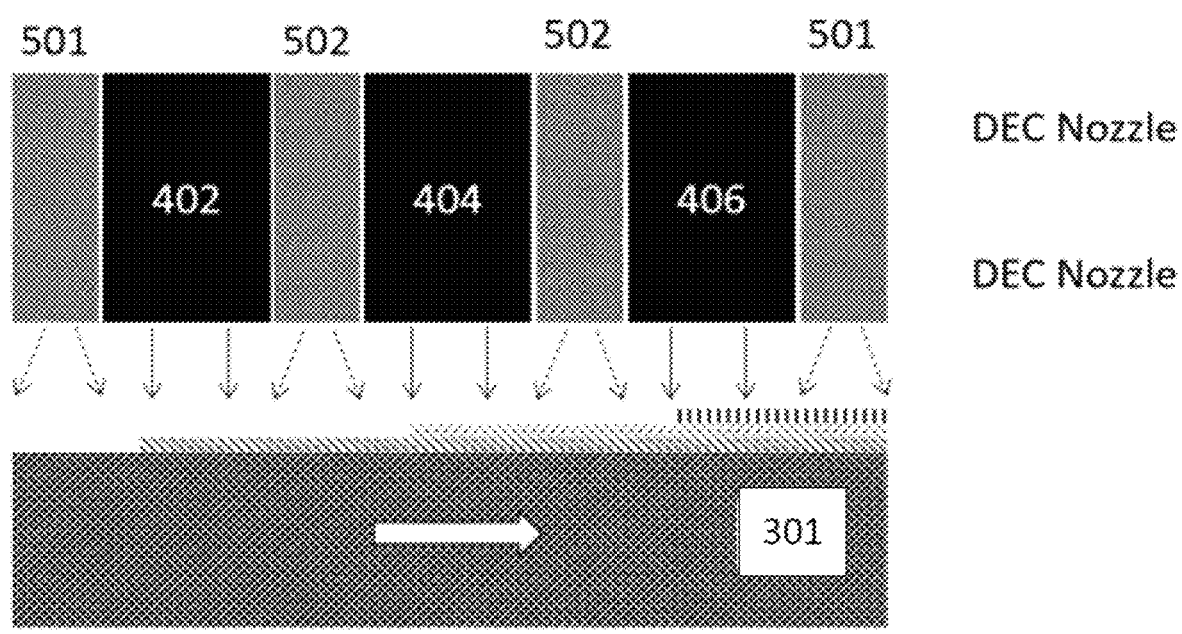
FIG. 5 shows an example process flow diagram of a device fabrication technique using only OVJP to deposit all organic layers of a device.

Contamination by residual gas exposure also may be reduced by reducing the concentration of residual gas in the vicinity of the substrate during printing. According to embodiments disclosed herein, this can be accomplished by the addition of one or more shield gas flows around micronozzle arrays, as shown in FIG. 5. Ambient gas in the OVJP deposition chamber typically is relatively stagnant, and the chamber contains outgassing components. Maintaining an overall water vapor level of 0.1 ppm or less in the chamber generally may not be feasible. A flowing shield gas as disclosed herein, however, can be purified so that water and $O_2$ levels are less than 0.001 ppm. Accordingly, it has been found that enveloping the printing zone in a shield gas flow substantially reduces exposure to residual gas while material is being deposited. Shield gas channels 501 mounted in front of and/or behind the depositing nozzle generate a purified gas flow that isolates the nozzle arrays from residual gasses that may be present in the chamber. Shield gas channels 502 that are mounted between nozzle arrays provide a source for the confinement gas necessary to achieve accurate patterning by DEC OVJP and prevent vapors from adjacent arrays from bleeding together. This enables molecularly sharp heterojunctions between sequentially deposited layers of organic thin film deposited on the substrate.

In some embodiments, shield flow distribution channels may be integrated into a micronozzle array or other similar structure. Alternatively, the shield flow distribution channel or channels may be external to the array. Further, the total shield flow around a nozzle array should exceed the total exhaust flow within the array. Shield gas flow should be sufficient to displace gas from the chamber ambient and prevent any of it from flowing into the exhaust apertures of the deposition heads.

Figure 6:
FIG. 6 shows a single unit deposition device surrounded by shield gas channels viewed from the perspective of the substrate according to an embodiment of the invention.
Figure 6:
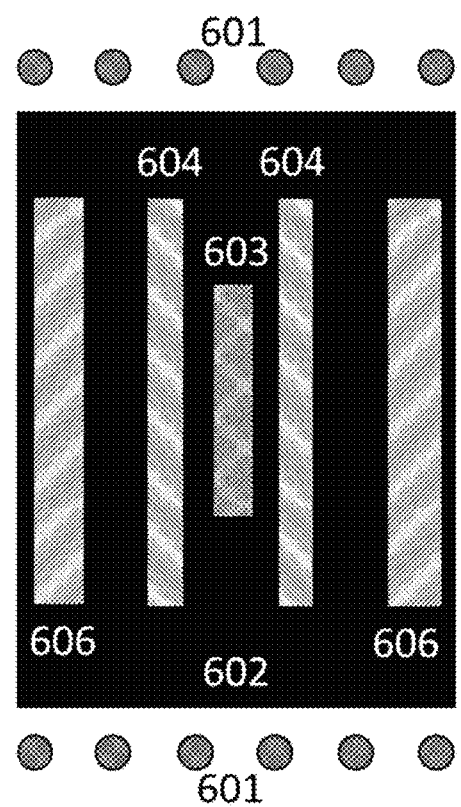

A close up view of a DEC-type depositor which has shield gas apertures 601 as disclosed herein is shown from the substrate-normal direction in FIG. 6. The depositor contains a single aperture or multiple apertures at the terminus of channels buried inside a monolithic nozzle block 602. The delivery aperture 603 delivers a mixture of one or more organic vapors entrained within an inert delivery gas. The exhaust aperture 604 is in communication with exhaust channels that withdraw gas from the region between the depositor and substrate. Optional confinement channels 605 are formed by depressions in the depositor face. These channels provide low resistance paths for confinement gas to flow from the edge of the nozzle block towards the midline of the depositor where it is needed to block the spread of organic vapor. The confinement channels are depicted in side view. They are perpendicular to the delivery and exhaust channels which terminate end-on in the delivery and exhaust apertures. The confinement flow blocks the spread of organic vapor by blocking the spread of the delivery flow and entraining surplus organic vapor in the outgoing exhaust flow. Confinement flow in this case is supplied by the gas ambient surrounding the depositor, which is from the shield gas flow as opposed to the chamber ambient. Alternatively, a confinement gas may be supplied via one or more confinement apertures 606 fed by channels that run parallel to the delivery and exhaust channels. Confinement gas comes from an external source in this case. If the mass flow though the confinement aperture exceeds the mass flow through the exhaust aperture, the excess confinement gas contributes to the shield gas flow. Confinement gas flows inward towards the exhaust apertures and shield gas flows away from the depositor towards the chamber ambient. They are distinct flows, although they may be drawn from a common gas reservoir.

Figure 7:
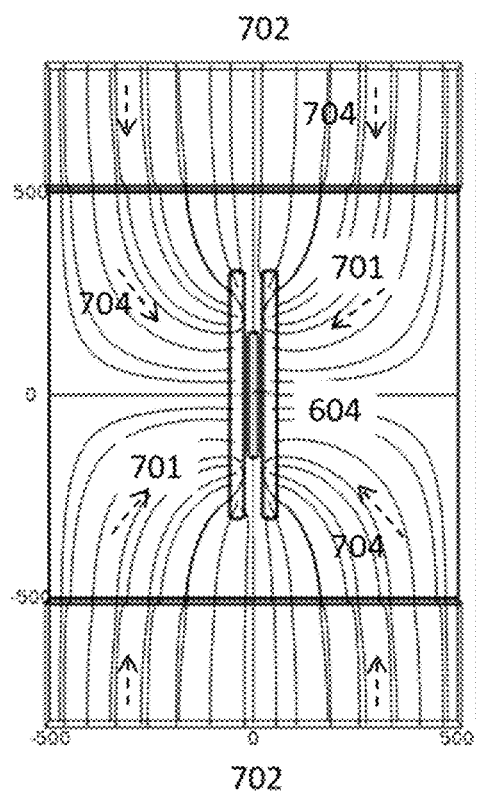
FIG. 7 shows streamlines of gas flow into the exhaust channels of a nozzle array with and without the introduction of shield gas according to an embodiment of the invention.
Figure 7:
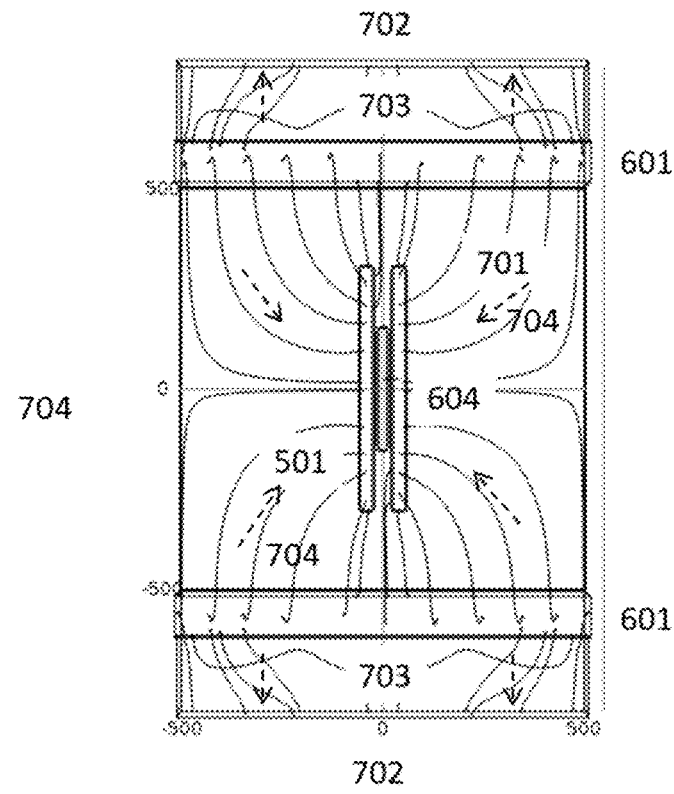

The beneficial effect of using a shield gas as disclosed herein becomes apparent when flow around the depositor is simulated with and without a shield gas flow using computational fluid dynamics. A single unit of a nozzle block having a linear multi-nozzle array is shown in FIG. 7. Neighboring depositors surround the simulated depositor in both cases. In the case where no shield gas is provided around the depositor, streamlines of confinement gas 701 are drawn from the chamber ambient 702 around the borders of the simulated zone. The confinement flow is drawn into the exhaust aperture after flowing over regions of the substrate intended for printing. When no shield gas is used, the streamlines show that the confinement gas is drawn from the chamber. When a shield gas is added, streamlines from the shield gas channels feed the confinement flow and are drawn into the exhaust apertures. Streamlines 703 moving outward from the shield gas channels towards the chamber ambient indicate a net outflow of shield gas from the deposition zone into the chamber. The direction of gas motion of each streamline region is illustrated by dashed arrows 704. This net outward flow may push contaminants away from the deposition zone. In some embodiments the shield gas may be provided into the deposition zone from an ultrahigh purity source, thereby making the composition of the shield gas much easier to control than that of the chamber ambient. In addition, each of the shield gas and the chamber gas (or confinement gas) can be the same or different composition.

Figure 8:
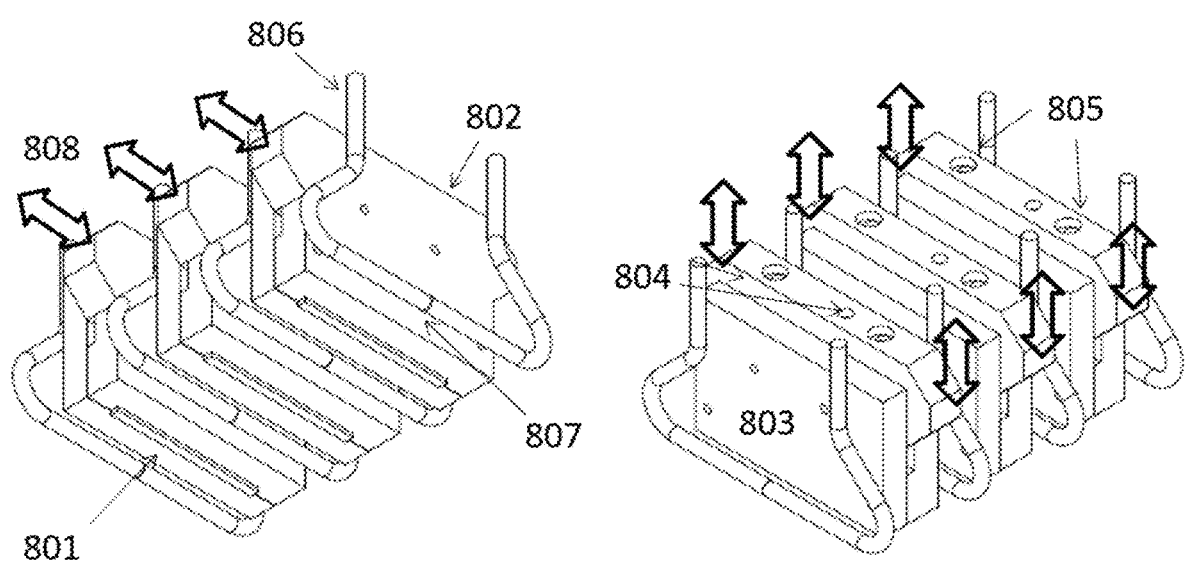
FIG. 8 shows a series of print heads with shield gas sources mounted in a common carriage according to an embodiment of the invention.

In an embodiment, nozzle arrays depositing each film may be carried on a common carriage, such as a single nozzle block, within a single deposition vessel to reduce the lag time between deposition of the first and last organic thin film layer on each printed zone of the substrate. An example of such an arrangement is depicted in FIG. 8. In this example, three micronozzle arrays 801 are each affixed within a print head clamp 802. Each print head clamp has an independent heater 803, an inlet port for delivery gas 804, and an outlet port for exhaust gas 805. Tubes for the distribution of shield gas 806 are located between print head clamps and at the ends of the assembly. The shield gas is distributed through pores at the base of the tube assembly 807. Each individual print head may be affixed to the carriage by joints that provide three degrees of freedom. In an embodiment, the print heads may be moved transversely to the direction of printing 808 to align the centerlines of its depositors to the centerlines of the depositors on other nozzle arrays within the carriage. Such an arrangement permits layers deposited by sequential print heads to overlay each other. In an embodiment, the top corners of each print head each may be moved in a direction parallel to the substrate normal. Such an arrangement permits control of the average separation between the micronozzle array and the substrate. It also may permit control of the angle between the bottom edge of the micronozzle array and the substrate.

Figure 9:
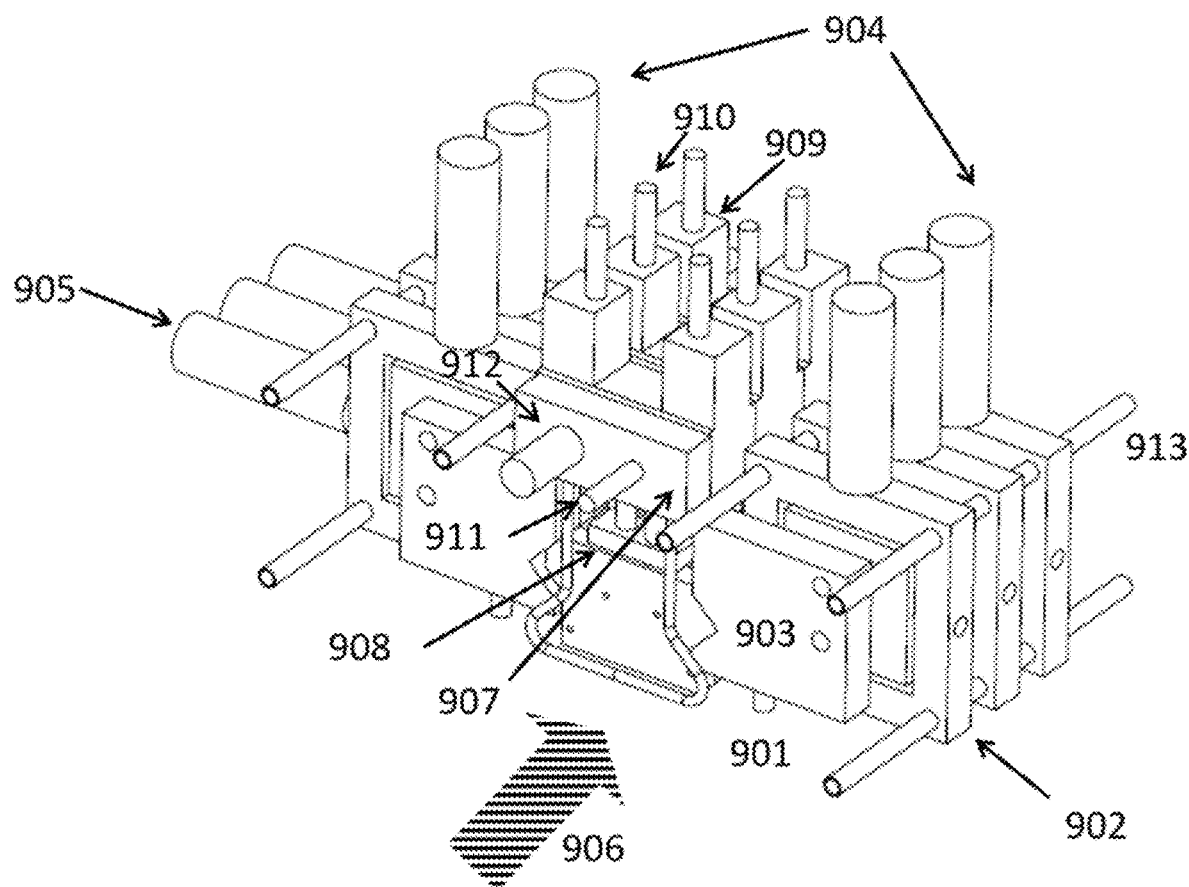
FIG. 9 shows an articulated carriage for a series of print heads according to an embodiment of the invention.

Individual print heads such as those shown in FIG. 8 may be mounted in the carriage such as is depicted in FIG. 9. Control of the fly height between the nozzle orifice and the substrate surface to within 1 μm may be desirable to ensure control and reproducibility of the printing process, with optimal control at ±1 μm or better. Compact optical displacement sensors 901 may be affixed relative to the side of each print head to permit active control of the nozzle to substrate gap. An additional optical sensor, mounted adjacent to the substrate, may topographically map the undersides of the micronozzle arrays to facilitate zeroing of the active control sensors. In an embodiment, individual print heads may be mounted to pairs of two-axis XY flexures 902 by self-centering clips 903. Fly height is adjusted by two motorized actuators 904 linked to the flexures. The carriage interfaces of each micronozzle array may move parallel to the plane of a stationary substrate, or the substrate may move with respect to a stationary carriage. The carriage may contain distribution channels for shield gas between nozzle arrays.

Control of the fly height g to within 1 μm may be desirable to ensure control and reproducibility of the printing process. In an embodiment the carriage includes nozzle arrays mounted on articulated segments to facilitate fine control. Each segment may include an independent displacement sensor to measure the distance to the substrate along each side of the array. Two actuators, one on each side of the array, actively adjust the elevation and tilt of the print head to achieve a preset distance at each side. An actuator that moves the nozzle arrays transversely to the direction of printing may be used to align the centerlines of the depositors of in a nozzle array to the centerlines of the depositors on other nozzle arrays.

The motors may move in the same direction to change the overall height of the print head and act in opposition to change its tilt with respect to the substrate. Transverse alignment of sequentially printed layer patterns may be adjusted by an actuator 905 acting orthogonally to both the fly height actuators and the direction of substrate motion 906. Shield and exhaust gasses may be addressed to each print head through a common manifold 907 that is sealed to each print head, such as through flex bellows assembly 908. The manifold also may contain one, two, or more organic vapor sources 909, depending on whether a given layer requires co-deposition. Each source may have a dedicated delivery gas line 910 connected to an independent mass flow controller. The shield gas feed 911 and exhaust port 912 may be distributed through the manifold as shown, or individually addressed to each carriage segment. A modular frame 913 can permit the carriage to be rapidly reconfigured to print different layer structures.

Figure 10:
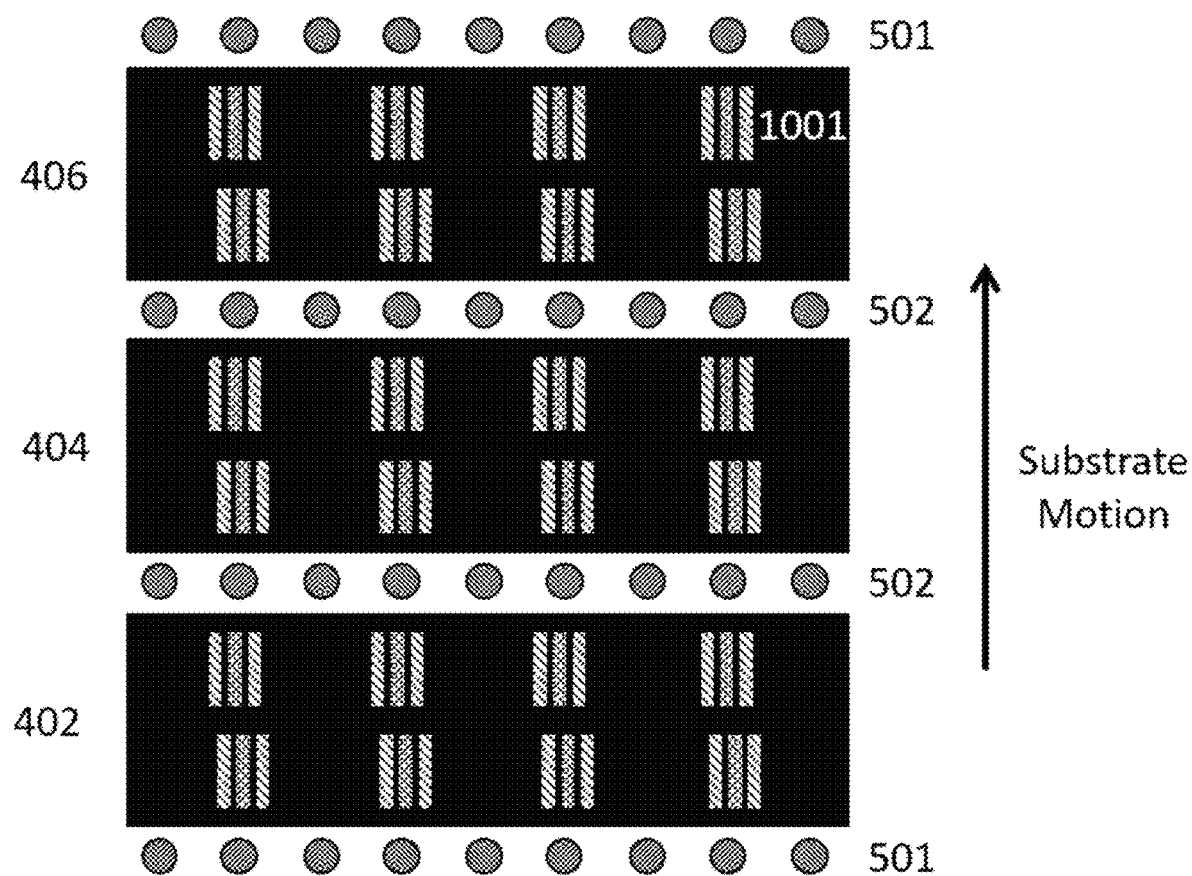
FIG. 10 shows an example of a nozzle array suitable for sequential deposition of multiple organic thin film layers according to an embodiment of the invention.

FIG. 10 shows an example of an embodiment of a print head designed to sequentially print a three-layer organic thin film. This is the same structure depicted in FIG. 4 viewed in the substrate normal direction. Each of the three nozzle arrays (402, 404, 406) deposits a separate layer of organic material on the substrate. Shield gas channels along the front and back of the series (501 and 502) of arrays provide shield gas to isolate the deposition zones from the chamber ambient while shield gas channels between arrays (502) isolate deposition zones with different species of organic vapor from each other. The depositors 1001 in each array are arranged two deep in this direction. The centerlines of each row of depositors are offset from the other perpendicularly to the direction of printing. Typically features printed by individual depositors tend to be thickest around along their centerlines, so thickness uniformity may be improved over the usable area of the feature by superimposing to printed features offset from each other.

Figure 11:
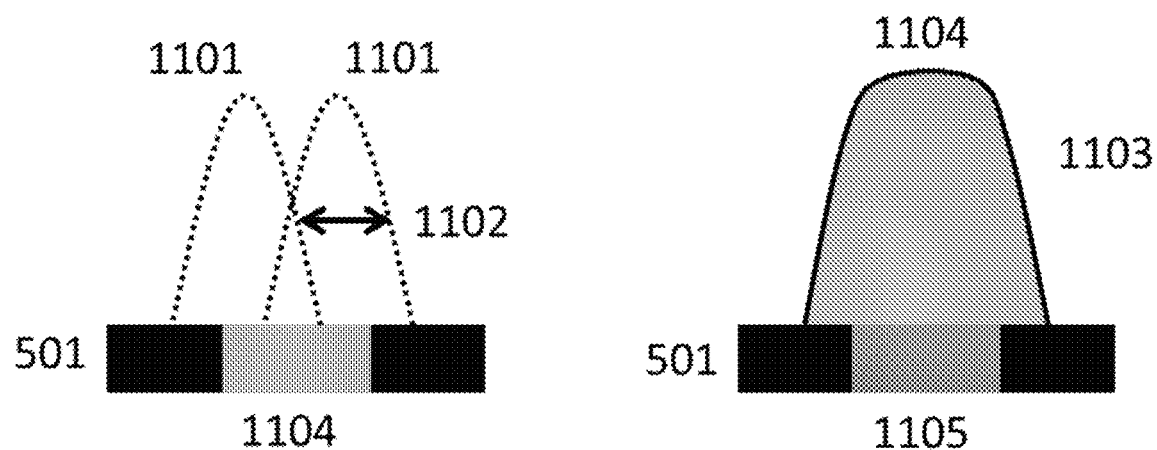
FIG. 11 shows an example technique of offsetting individual printed features to improve the thickness uniformity within an active area of the composite feature according to an embodiment of the invention.

An arrangement for improving feature uniformity by printing offset features according to an embodiment is illustrated in FIG. 11. The film thickness profiles of printed features are shown in cross section transverse to the direction of printing. When individual line features 1101 are offset from each other by a centerline to centerline distance roughly corresponding to the full width at half maximum (FWHM) 1102 of their thickness profiles, the two printed features superimpose to make a feature 1103 with a mesa-like thickness profile that has a high degree of flatness 1104 over the electrically addressed active area 1105 of the device being printed. While the offset rows of depositors used to print this structure are on a common nozzle block in FIG. 10, they may be located on adjacent nozzle blocks and a shield gas source may be located between them. The two nozzle blocks may deposit the same vapor mixture in this case.

Figure 12:
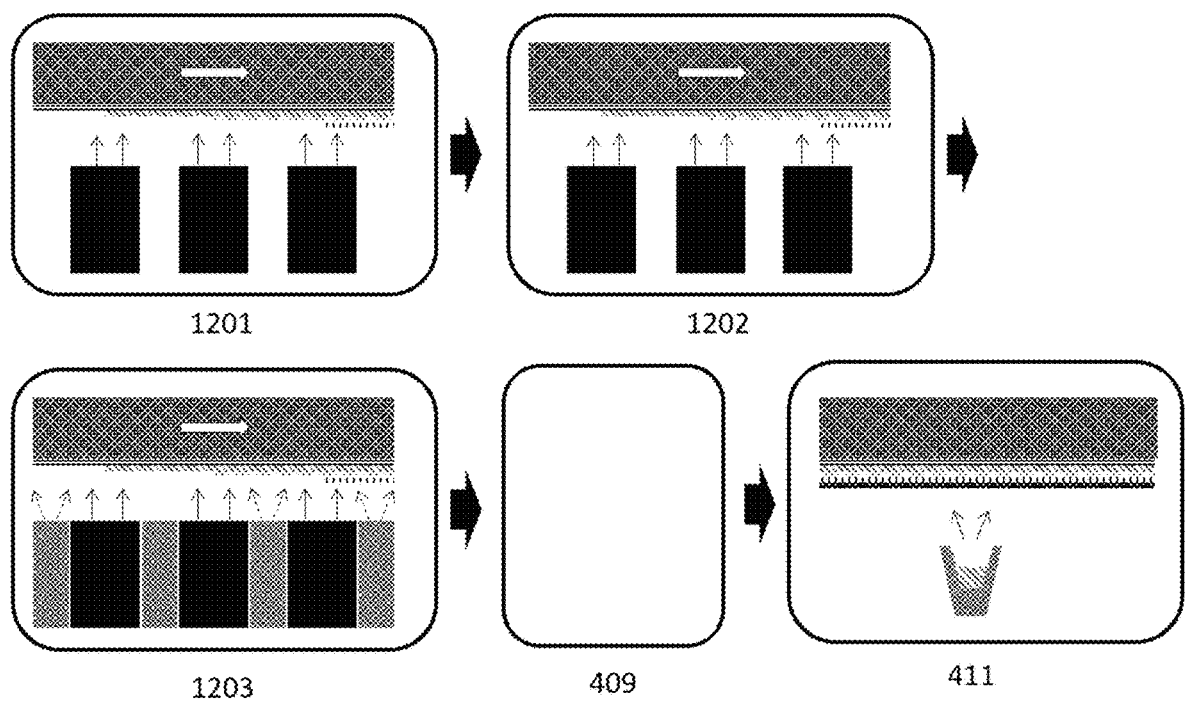
FIG. 12 shows an example process flow diagram of a three color deposition process using sequential DEC OVJP according to an embodiment of the invention.

In an embodiment, DEC OVJP techniques may be effectively expanded into a process for printing multicolor arrays by sequentially depositing all of the organic layers required for a first color and then sequentially depositing the layers required for each additional color, as shown in FIG. 12. For example, in an embodiment the organic layers for red emitting devices may be deposited in a first OVJP chamber 1201, the organic layers for green emitting devices may be deposited in a second OVJP chamber 1202, and the organic layers for blue emitting devices may be deposited in a third OVJP chamber 1203. Following deposition, the substrate may be transferred through a load lock to a vacuum chamber for the application of the electrode. Depositing an electrode after each OVJP step typically is not economical due to the necessity of masking substrate zones associated with different color devices. The order in which each type of device should be deposited may be best determined by its tolerance to the processing environment. For example, devices that are most susceptible to residual gas contamination may be printed last, so that the devices are capped with an electrode immediately afterward. Devices of each color may be printed one at a time, or each color may be printed simultaneously by a serial DEC OVJP heads.

Figure 13:
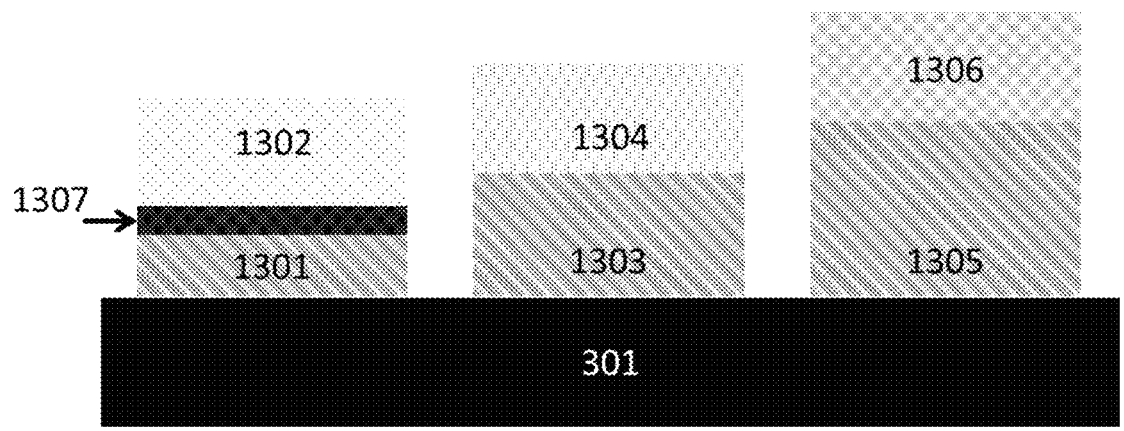
FIG. 13 shows an example architecture of an RGB OLED array printed using sequential DEC OVJP according to an embodiment of the invention.

The thickness and composition of each organic layer of every type of device in a multicolor OLED array may be controlled if DEC OVJP as disclosed herein is used to deposit sequential organic layers in an organic thin film stack. This may provide significant latitude to optimize the non-emissive layers present in each device type. Confinement techniques as disclosed herein also may be used to localize non-emissive layers to specific regions of the substrate, just as previously described for emissive layers. As an example, different HIL thicknesses can be used to engineer an optical cavity effects to enhance the emission of different emitters in a multicolor device array. A schematic example of a multicolor OLED array prior to cathode application is illustrated in FIG. 13. In the example, the HIL 1301 of the blue emitting device 1302 is thinner than the HIL 1303 of the green device 1304, which is in turn thinner than the HIL 1305 or the red emitting device 1306. Using techniques disclosed herein, layers may be added to some device types in an array without adding them to other device types where they are not needed. For example, an additional exciton blocking layer 1307 can be added around an emissive layer of a blue emitting device without increasing the electrical resistance of devices that emit at a longer wavelength in the same array.

In some embodiments, alternatively or in addition to the configurations previously disclosed herein, a confinement gas may be provided as a shield gas distributed through a chiller plate or similar structure. For example, organic vapor jet printing typically requires an actively cooled chiller plate between the substrate and the hot print head to keep the substrate cool. The print head interacts with the substrate through windows in the chiller plate, which is a planar structure mounted normal to the substrate. The chiller plate generally blocks the line of sight pathways for radiant or conductive heating of the substrate. The chiller plate typically is not necessarily wider than the substrate, but it will generally completely surround the area under the print head. An example of a basic chiller plate is described in U.S. Patent Publication No. 2011/0097495, which is incorporated by reference in its entirety. Modifications to such a structure are described herein, which may improve device lifetime.

It is often advantageous to deposit OLED materials at ambient pressures greater than those typically used with VTE. For example, organic vapor jet printing (OVJP) generally requires the presence of a continuum gas flow to resist the spread of organic vapor beyond the intended printing zones. Similarly, solvent-based deposition techniques require an ambient pressure greater than the vapor pressure of the solvent.

The presence of a relatively high pressure (50-800 Torr) ambient environment may complicate the removal of trace amounts of water vapor and other residual gasses from a vessel by slowing the rate of water diffusion within the chamber. Water sources that would deplete in days in a high vacuum environment may remain for months in a higher pressure ambient. Furthermore, techniques like OVJP require complex in-vessel hardware to perform and monitor the printing process. These can be both a source of long-lived virtual leaks and preclude a high temperature chamber bake to remove water.

Figure 14:
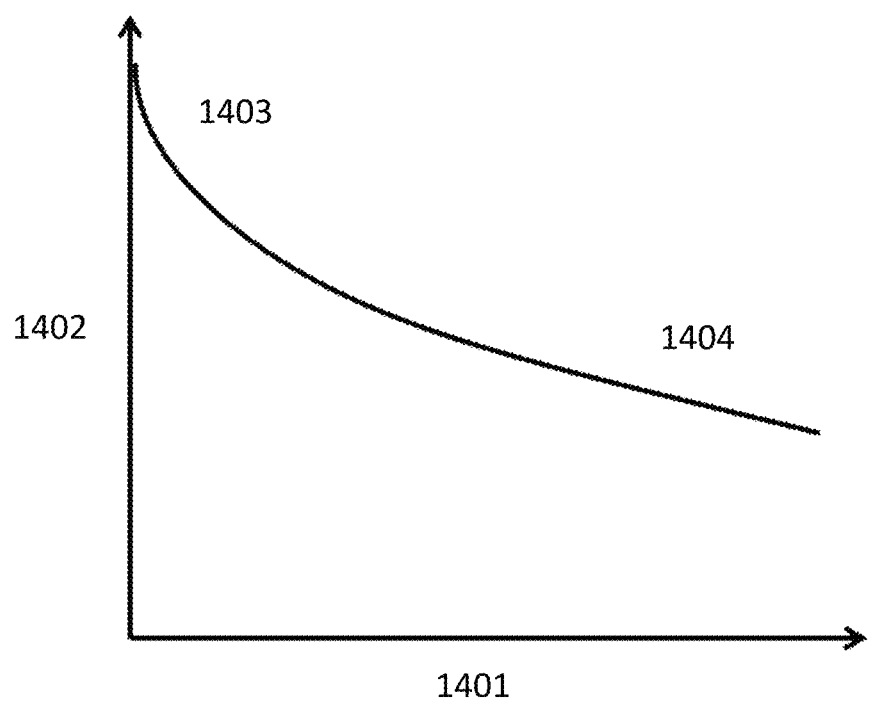
FIG. 14 shows examples of aging curves generated by an example OLED during a lifetime test.

It is known that the presence of water in the residual gas within a VTE chamber reduces the lifetimes of the resulting OLEDs. Aging, or decay, of an OLED manifests itself as a loss of efficiency over time. A typical aging curve for an OLED is shown in FIG. 14. The OLED is driven at constant current. The horizontal axis 1401 indicates the time the OLED is operated and the vertical axis 1402 shows the quantity of light emitted, normalized to the initial value. When started, the OLED undergoes a period of extrinsic decay 1403, so named because it results from the contamination of the OLED from residual gas and generally is not intrinsic to the operation of the OLED. The OLED then ages at a slower intrinsic rate 1404 that is relatively unaffected by the level of contamination. The lifetime of the OLED is defined as the period of time required for the device to drop below a fraction of its initial brightness, normally 95%. Low to moderate levels of contamination do not affect the initial performance of an OLED, nor do they affect its long term aging, however they can result in an irreversible loss of efficiency within the first few hours of operation of the OLED. If this efficiency loss is a significant fraction of what is allowed, its lifetime will be significantly shortened.

The aging of OLEDs was studied by Yamamoto et al. It was found that exposure of the HTL/EML interface to water vapor prior to EML deposition increases the amount of extrinsic decay when the OLED is initially operated. Exposure to water during and immediately after EML growth also causes significant extrinsic decay. Water vapor exposure either prior to the HTL deposition or after the electron transport layer deposition has little effect and exposed devices perform comparably to control devices grown entirely in low water vapor environment. It was also found that the initial efficiency at low brightness was adversely affected when the HTL is exposed to water vapor, while devices exposed at other stages of growth performed comparably to the control device. Thus, while it is advantageous to limit exposure to water throughout the OLED growth process, it may be particularly critical to limit water vapor exposure before and during EML growth.

In an embodiment, a conventional chiller plate is modified to inject an inert shield gas, such as argon, into the region between the print head and substrate. This shield gas distribution system greatly reduces the presence of water and other contaminants in the deposition zone. The present invention also reduces consumption of ultrapure confinement gas since it is not necessary to flood the chamber with the confinement gas species required for best printing performance, so long as the shield gas is comprised of this confinement gas species. A nitrogen ambient in the deposition chamber will suffice. Embodiments disclosed herein may dramatically reduce the partial pressure of water in the region between a print head and a substrate, thereby reducing the amount of water vapor that is incorporated into deposited films.

In an embodiment, ultrahigh purity shield gas is injected into the deposition zone at points surrounding the print head through nozzles within the chiller plate. The injected shield gas displaces the ambient in this region, along with any residual contaminant gasses that may be present in it. Sub part-per-billion concentrations of $H_2O$ and $O_2$ vapor can be readily obtained in the shield gas feed. Conversely, it may be difficult or impossible to reduce the level of contaminants in the larger and more stagnant volume the chamber ambient to comparable levels.

Figure 15:
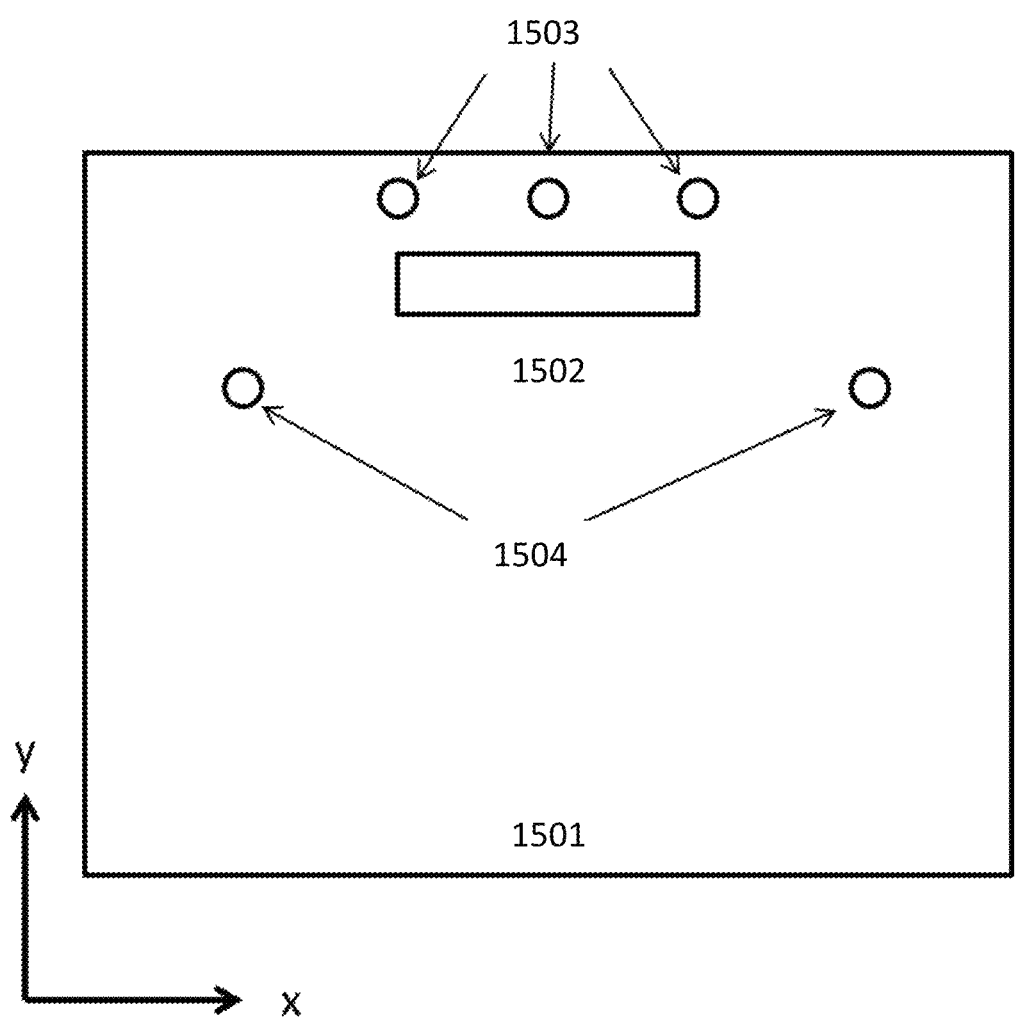
FIG. 15 shows a diagram of a chiller plate with a shield gas distribution according to an embodiment of the invention installed in OVJP deposition system.

An example of a shield gas distribution system integrated into a chiller plate according to an embodiment is shown in FIG. 15. The chiller plate 1501 is depicted in the substrate normal plane and the print head protrudes through a window 1502 located near the front of the plate. Three shield gas nozzles 1503 are positioned in front of the window and two nozzles 1504 are positioned to its rear. Print head components generally may prevent the rear nozzles from being mounted closer to the window in this case.

Figure 16:
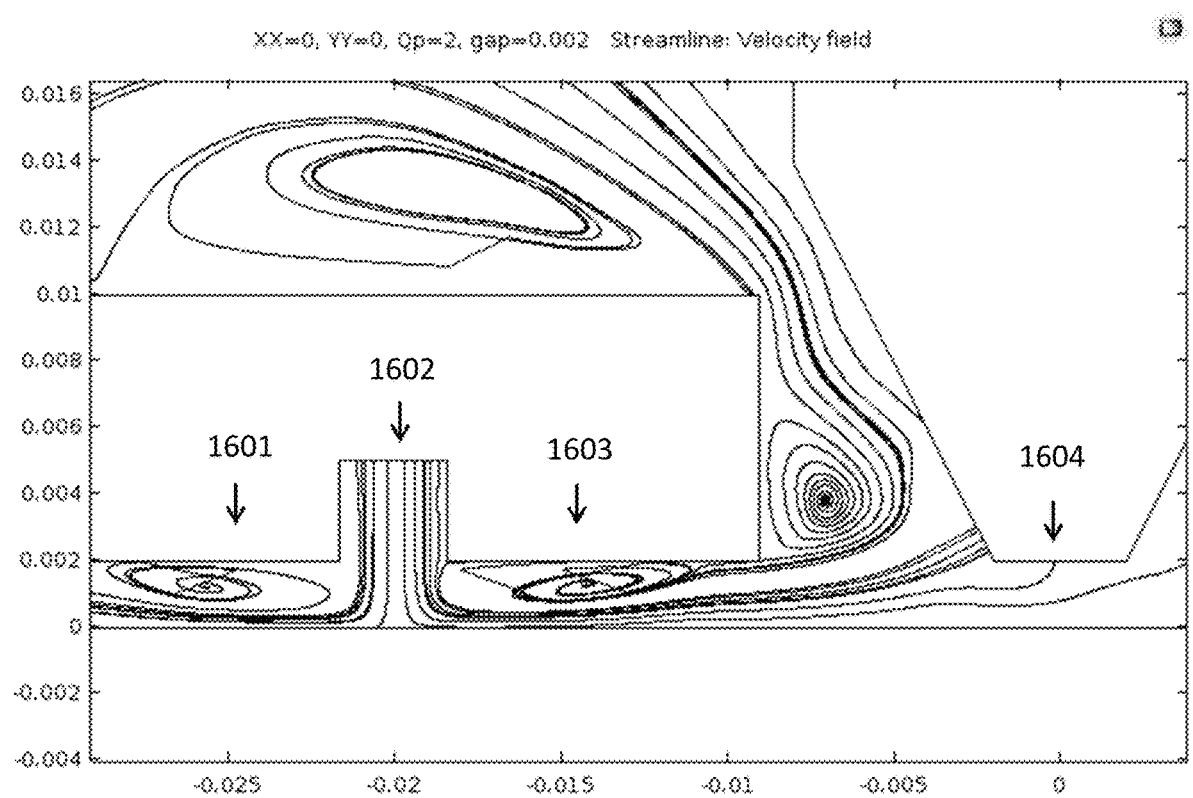
FIG. 16 shows a cross section of shield gas flow around chiller plate according to an embodiment of the invention.

A flow field of shield gas generated by such a distribution system is shown in FIG. 16. In the example, some of the shield gas 1601 from the forward nozzle 1602 flows outward to the edge of the chiller plate and some 1603 flows through its windows, blocking the ingress of contaminants into the printing zone. The shield gas also may flow underneath the print head 1604 to become the confinement gas used in processes like OVJP and other techniques, such as those described in U.S. Patent Publication No. 2015/0376787, the disclosure of which is incorporated by reference in its entirety. The shield gas flow may provide an ultrapure source of confinement gas to direct the deposition of organic vapor without contaminating the printing zone during the critical period when material is deposited.

Figure 17:
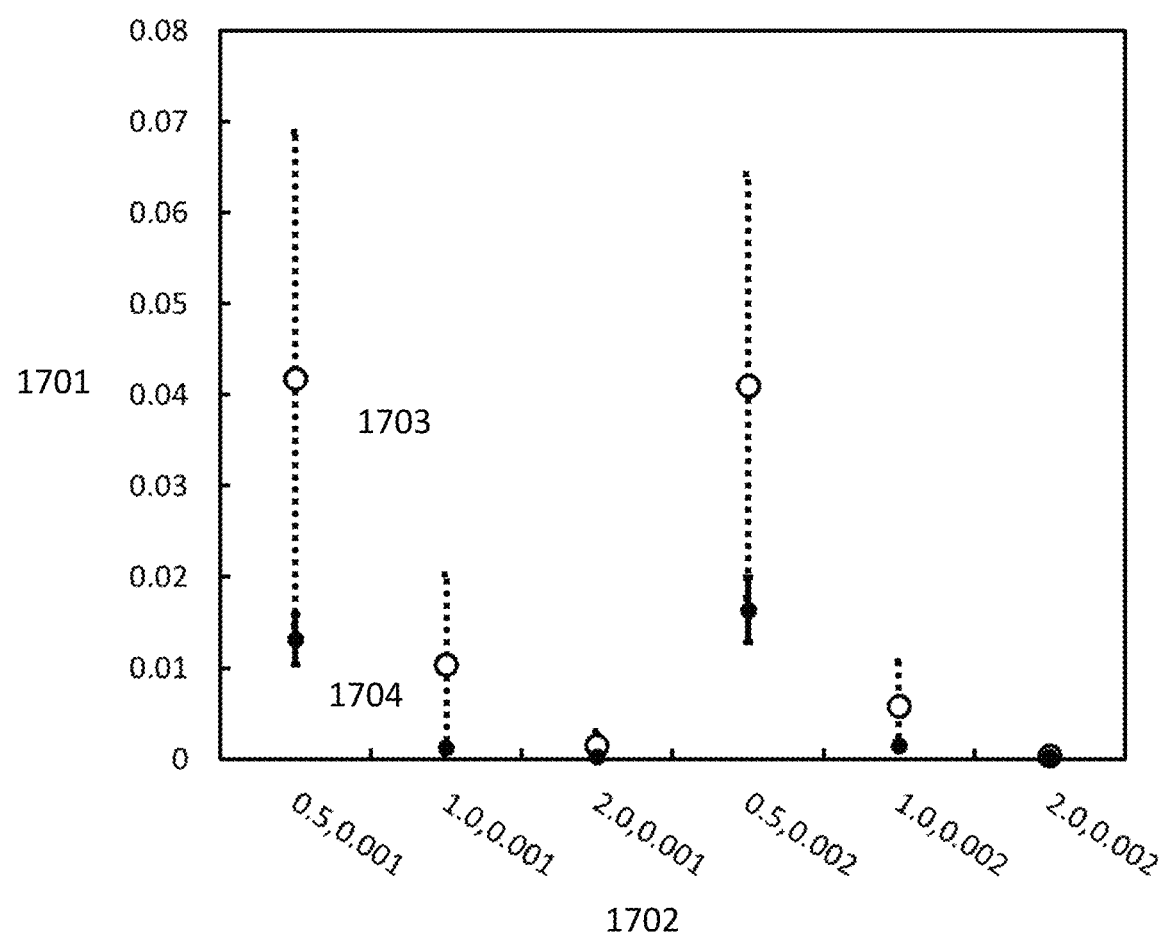
FIG. 17 shows a plot of normalized contaminant levels as a function of process conditions according to an embodiment of the invention.

A shield gas distributor configuration as disclosed above was modeled using computational fluid dynamics (CFD) to determine its efficacy at protecting the print zone from contaminants. The average partial pressure of a contaminant present in the printing zone is plotted in figure FIG. 17 along with the variance within the zone due to substrate motion during printing. The vertical axis 1701 shows the partial pressure of the contaminant normalized to its far field value outside the print zone. The horizontal axis 1702 is binned into 6 cases denoted as (Q,h) where Q is the rate of shield gas flow in sccm and h is the height of the region between the substrate and cold chiller plate in meters during printing. Two different data sets are plotted. The open circles 1703 indicate a substrate holder with a 13 mm border between the substrate and its edge and the closed circles 1704 indicate a case where the substrate has a 38 mm border surrounding it. Increasing the width of the border on the moving substrate holder that surrounds the substrate significantly decreases both the magnitude and variance of contaminant exposure by providing additional space for the shield gas flow to establish a diffusion barrier at the extrema of substrate motion. Exclusion of contaminants also may depend strongly on the rate of shield gas flow. Contaminant levels have the exponential decay expected for upstream diffusion. The magnitude of the gap between the substrate and chiller plate has little effect on the effectiveness of the substrate protection, so long as it is small compared to the in-plane dimensions of the system.

As indicated by the error bars, the effectiveness of the shield gas depend on the position of the substrate. The normalized maximum and minimum contaminant levels are tabulated by substrate holder position in Table 1 for the case of 2 slm argon flow, 2 mm chiller plate height and a 13 mm border around the substrate. When an edge of the substrate holder is relatively close to the print head, the diffusive barrier that contaminants must cross becomes shorter. The printing zone is generally cleaner when the substrate holder is close to the centerline along the x axis. The shield gas may become less effective as the substrate holder moves in the positive y direction, moving its rear edge closer to the window. The decrease in the length of the diffusive barrier is exacerbated by the relatively sparse distribution of shield gas in this region. A preferred embodiment of the distribution system will feature uniform distribution of shield gas around the print head.

TABLE 1

| Y\X (mm) | −50 | −25 | 0 | 25 | 50 |
|---|---|---|---|---|---|
| −50 | $1.4 \times 10^{-1}$ | $9.1 \times 10^{-2}$ | $8.0 \times 10^{-2}$ | $9.1 \times 10^{-2}$ | $1.4 \times 10^{-1}$ |
|  | $8.0 \times 10^{-2}$ | $6.1 \times 10^{-2}$ | $5.8 \times 10^{-2}$ | $2.0 \times 10^{-1}$ | $2.4 \times 10^{-1}$ |
| −25 | $1.4 \times 10^{-1}$ | $8.9 \times 10^{-2}$ | $9.3 \times 10^{-2}$ | $8.9 \times 10^{-2}$ | $1.4 \times 10^{-1}$ |
|  | $6.2 \times 10^{-2}$ | $6.2 \times 10^{-2}$ | $5.7 \times 10^{-2}$ | $2.0 \times 10^{-1}$ | $2.2 \times 10^{-1}$ |
| 0 | $1.4 \times 10^{-1}$ | $9.4 \times 10^{-2}$ | $1.0 \times 10^{-1}$ | $9.4 \times 10^{-2}$ | $1.4 \times 10^{-1}$ |
|  | $7.0 \times 10^{-2}$ | $6.1 \times 10^{-2}$ | $5.7 \times 10^{-2}$ | $2.0 \times 10^{-1}$ | $2.2 \times 10^{-1}$ |
| 25 | $1.4 \times 10^{-1}$ | $9.7 \times 10^{-2}$ | $9.3 \times 10^{-2}$ | $9.7 \times 10^{-2}$ | $1.4 \times 10^{-1}$ |
|  | $6.9 \times 10^{-2}$ | $6.1 \times 10^{-2}$ | $6.3 \times 10^{-2}$ | $2.1 \times 10^{-1}$ | $2.2 \times 10^{-1}$ |
| 50 | $1.8 \times 10^{-1}$ | $1.3 \times 10^{-1}$ | $1.2 \times 10^{-1}$ | $1.3 \times 10^{-1}$ | $1.8 \times 10^{-1}$ |
|  | $8.8 \times 10^{-2}$ | $7.7 \times 10^{-2}$ | $6.9 \times 10^{-2}$ | $2.2 \times 10^{-1}$ | $2.7 \times 10^{-1}$ |

(max) / (min)

Figure 18:
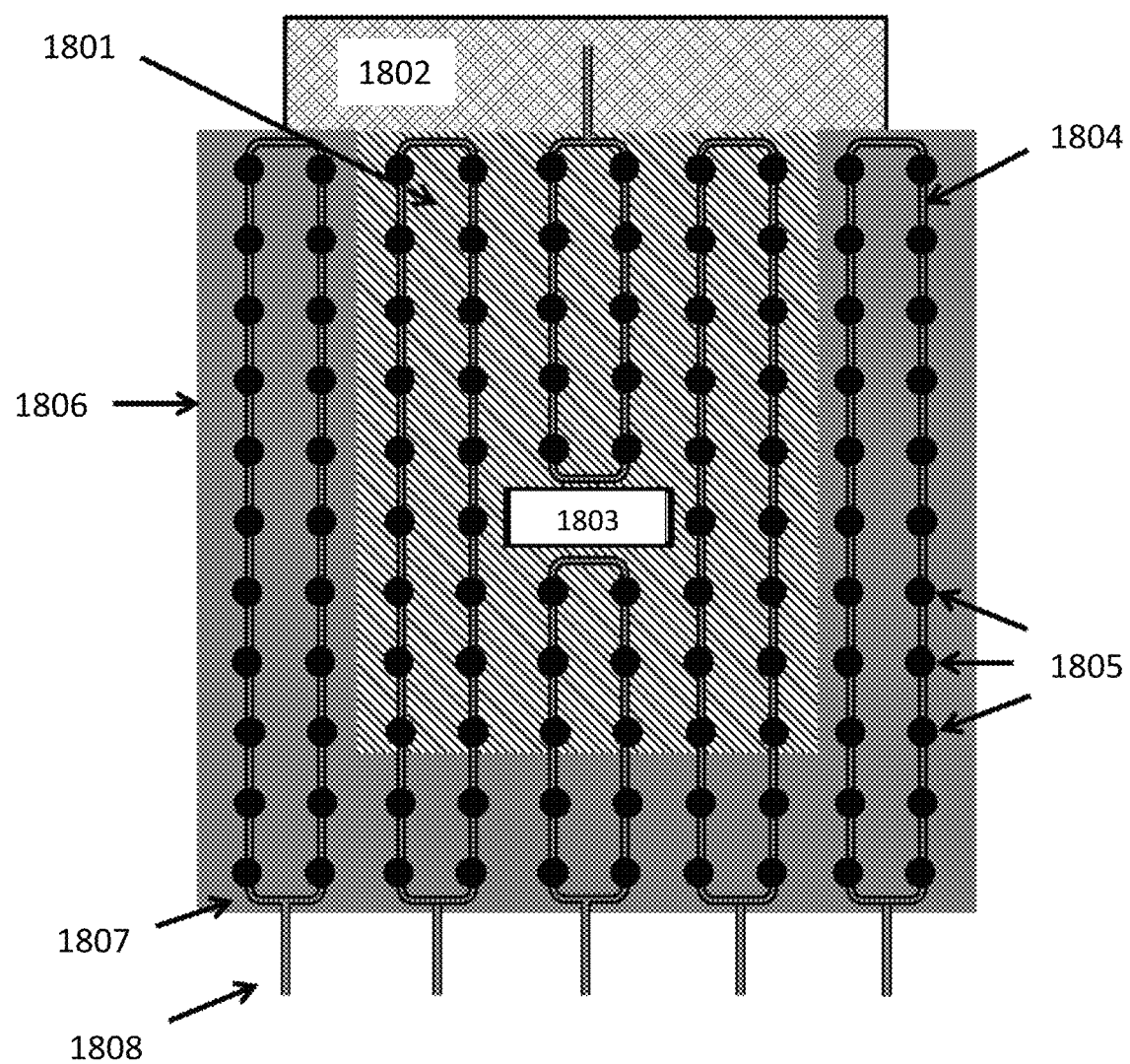
FIG. 18 shows an example of a shield gas distribution manifold incorporating a chiller plate according to an embodiment of the invention.

FIG. 18 shows an example of a preferred embodiment of a chiller plate as disclosed herein. A copper plate 1801, referred to as a chiller plate, with a thickness of 8 mm or more, is disposed between a heated printing apparatus and a movable platen carrying a substrate. The chiller plate may be fixed in position and may be supported independently of both the platen and the printing apparatus. The chiller plate is in thermal contact with a heat exchanger 1801 that provides active cooling. The printing apparatus interacts with the substrate the platen through one or more windows 1803 through the chiller plate as previously disclosed. The chiller plate and platen may be separated by 1-2 mm during operation.

The chiller plate contains manifolds 1804 that inject shield gas into the gap between the chiller plate and platen. The manifold contains outlet nozzles 1805 arranged in a grid at 25 mm intervals. The nozzles may be sized relative to the pathway connecting them so that flow through each is approximately equal. The chiller plate may be sufficiently long and wide so as to cover the platen over its entire range of motion. If it is not, then it may be desirable for the gas distribution manifold to extend beyond the chiller plate to cover the entire range of motion of the platen. In some embodiments, this outer region of the gas distribution manifold is covered by a baffle plate 1806 that is coplanar and flush with the base of the chiller plate. In general, the thickness and thermal conductivity of the baffle plate are not critical.

If the shield gas distributor is considerably larger than the substrate holder, it may not need to flow shield gas over its entire area to effectively protect the substrate, though it may be preferable to flow shield gas to the region that cover the substrate at a given time. The flow of shield gas to particular regions of the plate can be governed by independently set mass flow controllers (MFCs) and modulated in a manner synchronized to the position of substrate holder. The substrate normally moves rapidly in one direction in the OVJP process, while moving slowly in the other. An advantageous way to group shield gas ports therefore may be to arrange them in linear banks 1807 parallel to the direction of line printing that share a common feed 1808. Each bank may be slightly longer than a line printing stroke. The substrate holder may be moved rapidly in the direction of line printing, in which case the time constants required for flow adjustments may preclude tracking its motion in the line direction. The substrate may be moved much more slowly in the direction perpendicular to printed lines, in which case the shield gas flow rate can be much more readily adjusted in this direction.

Figure 19:
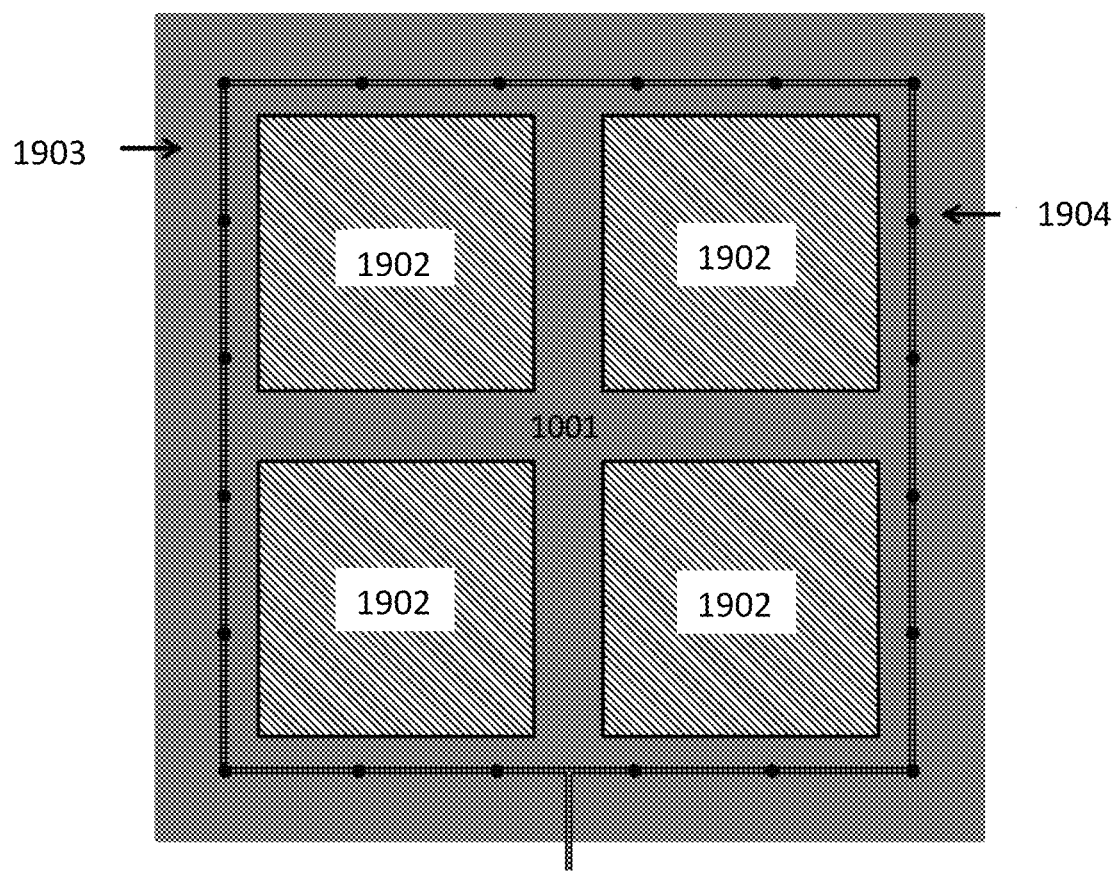
FIG. 19 shows a substrate platen containing a shield gas distribution manifold according to an embodiment of the invention.

Referring to FIG. 19, a platen 1901 may have one or more pockets 1902 dimensioned to accommodate one or more substrates surrounded by a border 1903. The border may extend, for example, at least 25 mm beyond the outermost edge of the outermost substrate. The border may also contain shield gas nozzles 1904. These nozzles can be used in lieu of a large gas distribution manifold; however it still may be preferred to use a close-coupled chiller plate, as there are shield gas nozzles around the print head.

Figure 20:
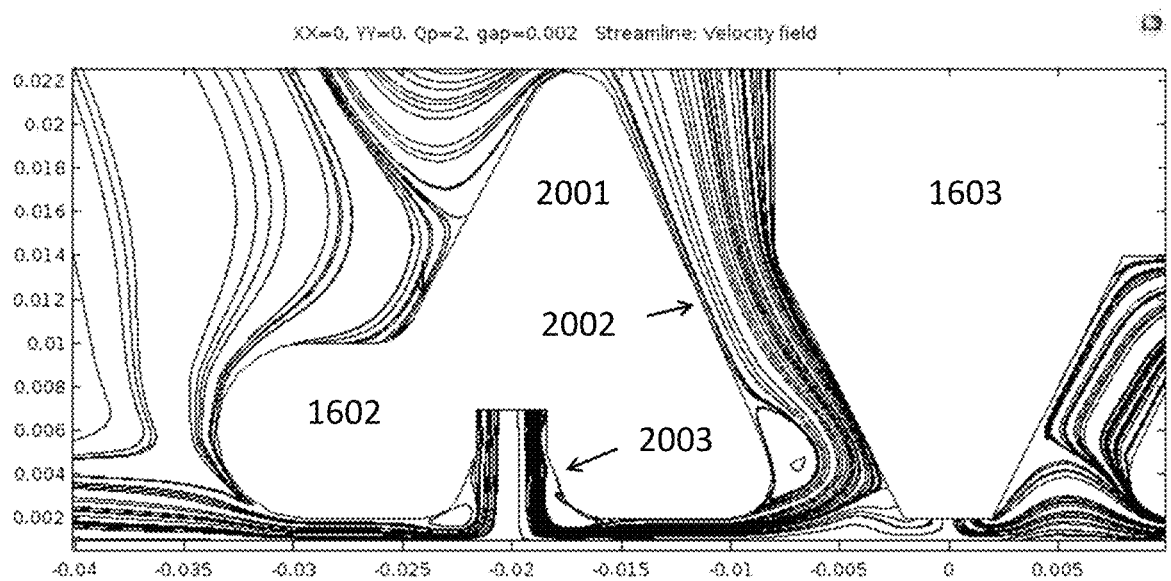
FIG. 20 shows a simulation of shield gas flow around a cross section of a chiller plate designed to promote laminar flow according to an embodiment of the invention.

Sharp corners within a shield gas flow path may generate eddies, as can be seen in FIG. 16. Contaminants that diffuse into these eddy zones may not be efficiently cleared, so the shield gas may be more effective if its flow path is designed to promote laminar flow. This can be achieved by rounding the edges of the through chiller plate windows as shown in FIG. 20, which shows an example of gas flow around a cross-section of a chiller plate as disclosed herein. The print head and related apparatus also may be rounded. A fairing 2001 installed on the reverse side of the chiller plate may restrict the width of the flow path 2002 between an OVJP print head 1603 and the chiller plate, and may reduce turbulence in the outgoing flow of shield gas. The nozzle injecting the shield gas 1602 may have a chamfered or diverging edge 2003 at the intersection with the chiller plate surface. This may reduce eddy formation around the jet. The height between the chiller plate and substrate also may be reduced, for example from 2 mm to 1 mm, to further reduce turbulence.

Figure 21:
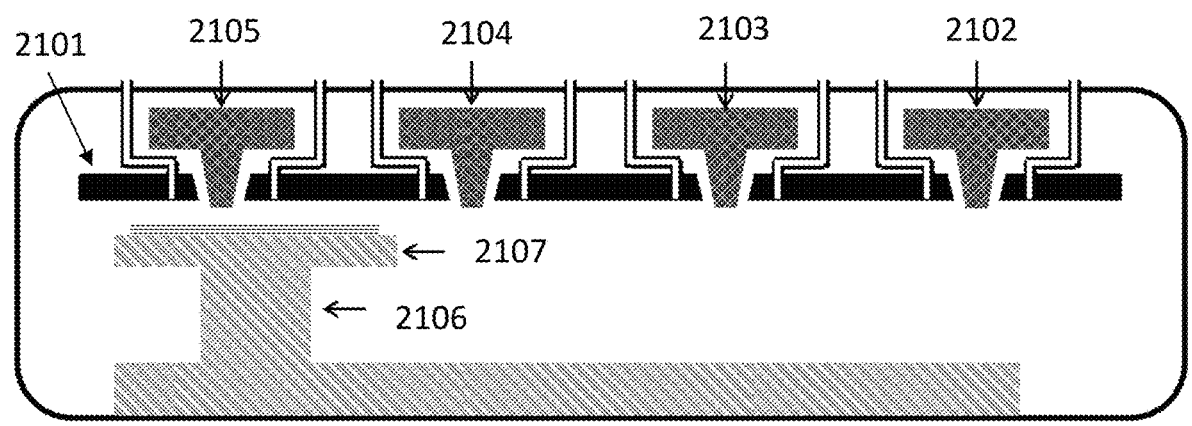
FIG. 21 shows an example of a multi-print head deposition tool incorporating a large shield gas distribution manifold according to an embodiment of the invention.

If a feature can be printed in a single pass or remain under the shield area for multiple passes, then the shield gas distributor may reduce or eliminate the problem of contaminant inclusion in the deposited layer. This improves the lifetime of the OLED. However, it may be possible for the heterojunctions between layers to become contaminated. To minimize extrinsic decay and achieve improved lifetimes, it may be desirable for the entire substrate to be kept under a layer of flowing shield gas throughout the deposition cycle. In some cases, it may be preferred, at a minimum, for the shield gas to protect the substrate between HTL and EML deposition. This can be accomplished, as shown in FIG. 21, with a lengthened chiller plate and shield gas manifold 2101 that accommodates deposition tools for both the HTL 2102 and EML 2103, 2104, 2105. This plate can be further enlarged to accommodate print heads for multiple colors as depicted, thereby maintaining the substrate under shield flow for the entire printing process. A robot or other mechanism 2106 carrying the platen 2107 with mounted substrates also may be enlarged to permit a full range of motion underneath each deposition tool.

Figure 22:
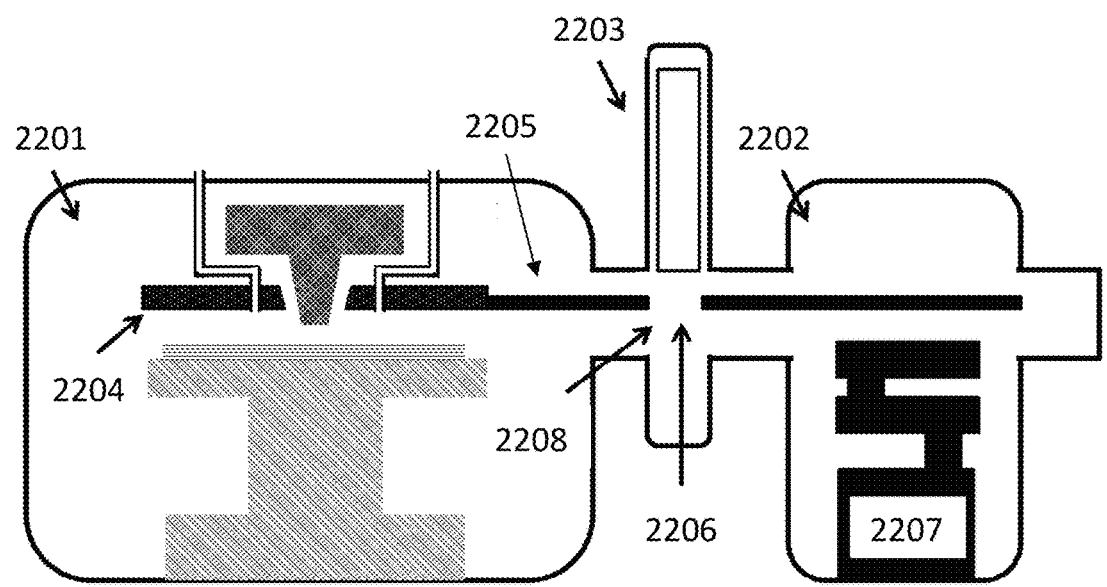
FIG. 22 shows an example of a deposition tool with adjacent load locks equipped with a shield gas distribution manifold according to an embodiment of the invention.

Protecting the substrate through the entire deposition cycle of a printing apparatus as shown may require that the substrate is covered by shield gas not only within the deposition chamber but also while it is in any load lock(s) used to equalize pressure for substrate transfer between the printing apparatus and other process vessels. FIG. 22 shows an example of a printing tool 2201 that is connected to a load lock 2202 through a gate valve 2203. In this example, the shield gas distribution system that surrounds the print head is integrated with the chiller plate 2204. Shield gas is distributed between the print head and the gate valve through a thinner baffle 2205 that is not required to sink heat generated by the print head. There is a similar baffle 2206 situated above the substrate transfer mechanism 2207 to provide the substrate with shield gas protection before and/or after transfer. The baffles in the deposition chamber and load lock may be separated by a break 2208 to permit closure of the gate valve. Less expensive gas species with lower purity than the shield gases can be used to backfill the load lock. The shield gas in the load lock, printing zone, and the transfer track between them need not be the same species.

Figure 23:
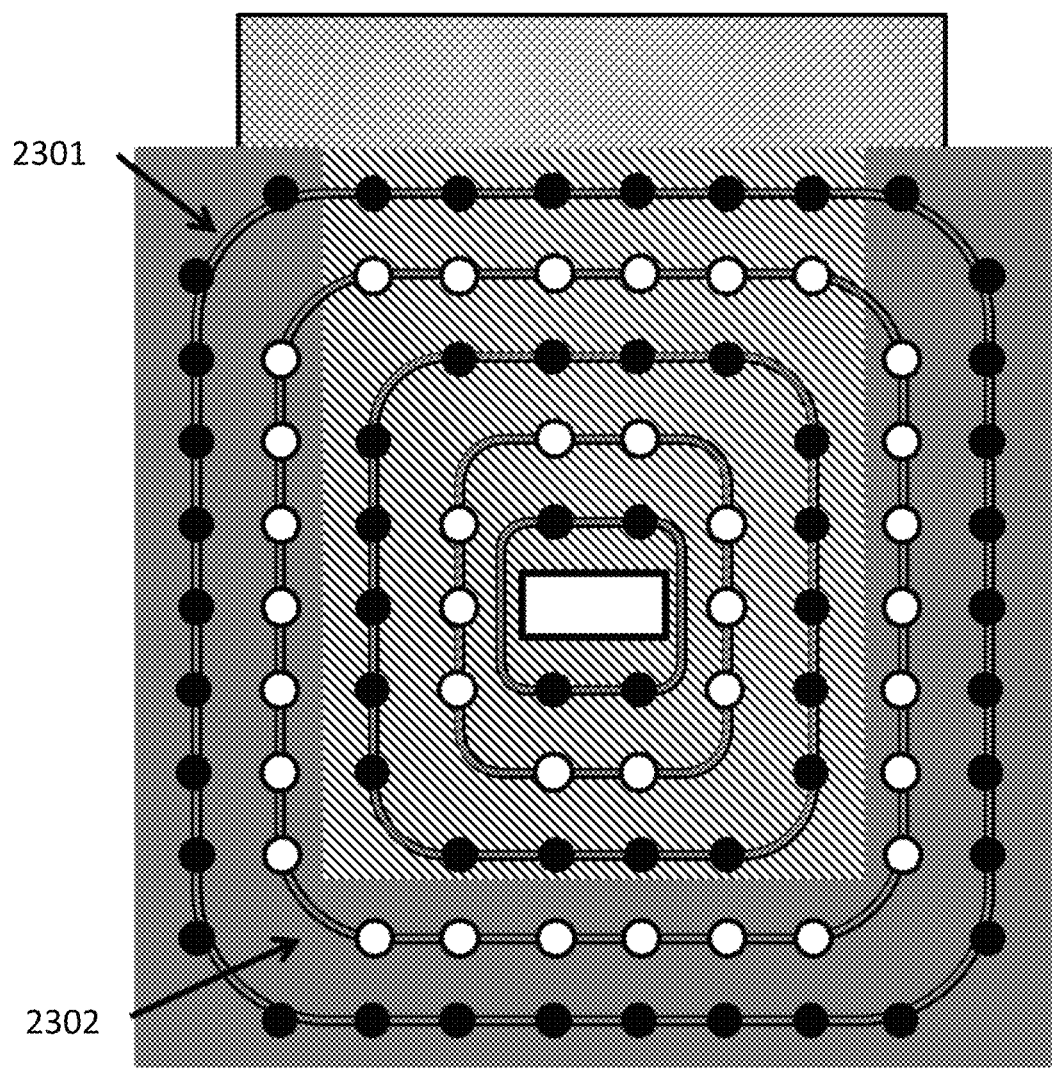
FIG. 23 shows an example of a shield gas distribution manifold with alternating perimeters of shield gas nozzles and vacuum apertures according to an embodiment of the invention.

A shield gas distributor as disclosed herein also may incorporate vacuum vents that withdraw shield gas from the gap between the chiller plate and substrate as shown in FIG. 23. Concentric perimeters of shield gas injection nozzles 2301 may be interlaced with vacuum nozzles that withdraw shield gas 2302 from the gap separating the platen and chiller plate.

A deposition chamber of a laboratory-scale OVJP tool was modeled by computational fluid dynamics (CFD) using COMSOL Multiphysics. A variety of chiller plate to substrate holder heights and shield gas hole positions were modeled. A binary diffusivity of $4.4 \times 10^{-4}$ m$^2$/s was calculated for water vapor in argon using kinetic theory. Reductions of 10× or more in the print zone were demonstrated by these simulations using the shield gas distribution manifold configuration depicted in FIG. 15. This model was subsequently used to evaluate the performance of the preferred embodiments.

As used herein, unless explicitly specified to the contrary, a "confinement gas" refers to a gas that is introduced into the deposition chamber, but is withdrawn from the deposition region so as to control the spread of organic material and prevent the organic material from being deposited on undesired portions of the substrate. Confinement gas may be introduced in or near the deposition region or may be the chamber ambient. In contrast, unless explicitly indicated to the contrary, as used herein a "shield gas" is a gas that is provided in the region of a deposition device such as a print head, and flows away from the device so as to prevent spread of contaminants into the deposition zone. In some embodiments, a confinement gas flow is provided by and/or drawn from a shield gas flow. For example, in some embodiments one or more apertures is used to provide a flow of gas that operates as both a shield gas and as a confinement gas. The portion of the gas flow that provides confinement will be removed by one or more exhausts, typically disposed within the nozzle block, whereas the portion of the gas flow that provides the shield gas will be removed by one or more chamber exhausts after leaving the region of the nozzle block. Generally, the shield gas flow will be a relatively fast-flowing stream of highly-purified gas as previously disclosed, which displaces any other material that may be in the deposition region.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of depositing at least two thin film layers on a substrate in a single deposition chamber, each of the at least two thin film layers being compositionally distinct from the other or spatially offset so that each film is only partially overlapping with the others, the method comprising:

independently controlling a separation and an angle between a first delivery aperture on a first nozzle block that is mounted to have three degrees of freedom and that is disposed within a deposition chamber and a substrate by moving the first nozzle block in a direction parallel to the substrate normal, wherein a direction of the substrate normal is perpendicular to a surface of the substrate that faces the first delivery aperture, and ejecting a first deposition mixture from the first delivery aperture toward the substrate;

ejecting a second deposition mixture from a second delivery aperture on a second nozzle block toward the substrate; and ejecting a first shield gas from a first shield gas aperture; and removing material from the deposition chamber via a first exhaust aperture in the first nozzle block;

wherein the first shield gas prevents material from a chamber ambient to the deposition chamber from reaching the first exhaust aperture and prevents the first deposition mixture ejected by the first delivery aperture from entering a region comprising at least a region between the second delivery aperture and the substrate.

2. The method of claim 1, wherein the first deposition mixture and the second deposition mixture do not share any common materials.

3. The method of claim 1, wherein the first deposition mixture comprises a material that is present in the second deposition mixture, and the ratio of materials in the first deposition mixture is different than the ratio of materials in the second deposition mixture.

4. The method of claim 1, further comprising moving at least one of the first nozzle block and the substrate relative to the other during ejection of the first deposition mixture and the first shield gas.

5. The method of claim 1, wherein the total flow of shield gas around the first nozzle block exceeds the total flow of exhaust through the first nozzle block.

6. The method of claim 1, wherein the total flow of exhaust gas through the first exhaust aperture in the first nozzle block exceeds the total flow of the first deposition mixture through the first delivery aperture in the first nozzle block.

7. The method of claim 1, wherein the ambient pressure in the single deposition chamber is in the range of 10 Torr-1000 Torr.

8. The method of claim 1, further comprising reducing a fly height between the first nozzle block and the substrate when the first delivery aperture is over a region of the substrate on which the first deposition mixture is to be deposited, and increasing the fly height between the first nozzle block and the substrate when the first delivery aperture is over a region of substrate on which the first deposition mixture is not to be deposited.

* * * * *